United States Patent
Wallis et al.

(10) Patent No.: US 11,544,562 B2
(45) Date of Patent: Jan. 3, 2023

(54) PERCEIVED MEDIA OBJECT QUALITY PREDICTION USING ADVERSARIAL ANNOTATIONS FOR TRAINING AND MULTIPLE-ALGORITHM SCORES AS INPUT

(71) Applicant: Amazon Technologies, Inc., Seattle, WA (US)

(72) Inventors: Thomas Sydney Austin Wallis, Tuebingen (DE); Luitpold Staudigl, Bonn (DE); Muhammad Bilal Javed, Berlin (DE); Pablo Barbachano, Berlin (DE); Mike Mueller, Tuebingen (DE)

(73) Assignee: Amazon Technologies, Inc., Seattle, WA (US)

( * ) Notice: Subject to any disclaimer, the term of this patent is extended or adjusted under 35 U.S.C. 154(b) by 391 days.

(21) Appl. No.: 16/875,887

(22) Filed: May 15, 2020

(65) Prior Publication Data
US 2021/0357745 A1    Nov. 18, 2021

(51) Int. Cl.
*G06N 3/08*  (2006.01)
*G06N 3/04*  (2006.01)
*G06F 30/27*  (2020.01)

(52) U.S. Cl.
CPC .............. *G06N 3/08* (2013.01); *G06F 30/27* (2020.01); *G06N 3/04* (2013.01)

(58) Field of Classification Search
CPC .. G06N 3/02; G06N 3/08; G06N 3/04; G06N 3/086; G06N 3/0454; G06F 30/27
USPC ............................................ 706/20
See application file for complete search history.

(56) References Cited

U.S. PATENT DOCUMENTS

| | | | |
|---|---|---|---|
| 6,075,884 | A | 6/2000 | Lubin et al. |
| 10,362,934 | B2 | 7/2019 | Greivenkamp, Jr. et al. |
| 2018/0240017 | A1 | 8/2018 | Huszar et al. |
| 2019/0258902 | A1 | 8/2019 | Colligan et al. |
| 2020/0126263 | A1 | 4/2020 | Dinh et al. |
| 2022/0101146 | A1* | 3/2022 | el Kaliouby ............. G06N 3/08 |

FOREIGN PATENT DOCUMENTS

EP    3624452 A1    3/2020

OTHER PUBLICATIONS

International Search Report and Written Opinion dated Jul. 15, 2021 in PCT/US2021/029161, Amazon Technologies, Inc., pp. 1-15.

(Continued)

*Primary Examiner* — Paul Dinh
(74) *Attorney, Agent, or Firm* — Robert C. Kowert; Kowert, Hood, Munyon, Rankin & Goetzel, P.C.

(57) ABSTRACT

Respective labels indicative of compression-related quality degradation for a set of media object tuples which meet a divergence criterion are obtained; each tuple comprises a reference media object and a pair of corresponding compressed media object versions. Pairs of training records for a machine learning model are generated using the labeled media object tuples and multiple perceptual quality algorithms, with each training record comprising respective perceived quality degradation scores generated by each of the multiple algorithms for a given compressed media object of a tuple. A machine learning model is trained, using the record pairs, to predict quality degradation scores for compressed media objects.

20 Claims, 19 Drawing Sheets

(56) References Cited

OTHER PUBLICATIONS

Tal Ben-Nun et al., "Demystifying Parallel and Distributed Deep Learning: An In-Depth Concurrency Analysis," arXiv.org, Feb. 26, 2018, 1802-09941, pp. 1-47, Cornell University Library, Ithaca, NY.
J. Alakuijala, et al., "Guetzli: Perceptually Guided JPEG Encoder", arXiv:1703.04421v1, Mar. 13, 2017, pp. 1-13.
Sebastian Bosse, et al., "Deep Neural Networks for No-Reference and Full-Reference Image Quality Assessment", in IEEE Transactions on Image Processing, vol. 27., No. 1, Jan. 2018, pp. 206-219.
John Cass, et al., "Evidence for two interacting temporal channels in human visual processing", Vision Research 46, 2006, pp. 2859-2868.
Jongyoo Kim, et al., "Deep Convolutional Neural Models for Picture-Quality Prediction", in IEEE Signal Processing Magazine, Nov. 2017, pp. 130-141.
Valero Laparra, et al., "Perceptual image quality assessment using a normalized Laplacian pyramid", Society for Imaging Science and Technology, IS&T International Symposium on Electronic Imaging 2016, Human Vision and Electronic Imaging 2016, pp. 1-6.
Rafal Mantiuk, et al., "HDR-VPD-2: A calibrated visual metric for visibility and quality predictions in all luminance conditions", in ACM Transaction on Graphics, vol. 30, No. 4, Article 40, Jul. 2011, pp. 40:1-40:13.
M. Perez-Ortiz, et al., "A practical guide and software for analysing pairwise comparison experiments", arXiv:1712.036862, Dec. 15, 2017, pp. 1-20.
Maria Perez-Ortiz, et al., "From Pairwise Comparisons and Rating to a Unified Quality Scale", IEEE Transactions on Image Processing, Institute of Electrical and Electronics Engineers, 2019, pp. 1139-1151.
Nikolay Ponomarenko, et al, "Image database TID2013: Peculiarities, results and perspectives", Signal Processing: Image Communication 30, ELSEVIER, 2015, pp. 57-77.
Nikolay Ponomarenko, et al., "TID2008—A Database for Evaluation of Full-Reference Visual Quality Assessment Metrics", Advances in Modem Radioelectronics 10.4, 2009, pp. 30-45.
Ekta Prashnani, et al., "PieAPP: Perceptual Image-Error Assessment through Pairwise Preference", in Proceedings of the IEEE Conference on Computer Vision and Pattern Recognition, 2018, pp. 1808-1817.
Rafael Reisenhofer, et al., "A Haar Wavelet-Based Perceptual Similarity Index for Image Quality Assessment", arXiv:1607.06140v4, Nov. 6, 2017, pp. 1-19.
Katherine Storrs, et al., "Adaptive Paired-Comparison Method for Subjective Video Quality Assessment on Mobile Devices", in 2018 Picture Coding Symposium (PCS), Jun. 2018, IEEE, pp. 169-173.
Domonkos Varga, "A comprehensive evaluation of full-reference image quality assessment algorithms on KADID-10k", arXiv:1907.02096v1, Jul. 3, 2019, pp. 1-13.
Zhou Wang, et al., "Why is Image Quality Assessment so Difficult?", in IEEE International Conference on Acoustics Speech and Signal Processing, May 2002, pp. 1-4.
Zhou Wang, et al., "Image Quality Assessment: From Error Visibility to Structural Similarity", IEEE Transactions on Image Processing, vol. 13, No. 4. Apr. 2004, pp. 1-14.
Zhou Wang, et al., "Multi-Scale Structural Similarity for Image Quality Assessment", The Thirty-Seventh Asilomar Conference on Signals, Systems and Computers, 2003, IEEE, vol. 2, pp. 1-5.
Zhou Wang, et al., "Maximum differentiation (MAD) competition: A methodology for comparing computational models of perceptual quantities", Journal of Vision, 2008, pp. 1-13.
Krzysztof Wolski, et al., "Dataset and metrics for predicting local visible differences", ACM Transaction on Graphics, vol. 36, No. 4, Article 1, Jul. 2017, pp. 1-14.
Nanyang Ye, et al., "Visibility Metric for Visually Lossless Image Compression", 2019 Picture Coding Symposioum (PCS), IEEE, 2019 pp. 1-5.
Nanyang Ye, et al., "Predicting visible image differences under varying display brightness and viewing distance", Proceedings of the IEEE/CVF Conference on Computer Vision and Pattern Recognition, 2019, pp. 5434-5442.
Lin Zhang, et al., "FSIM: A Feature Similarity Index for Image Quality Assessment", IEEE Transactions on Image Processing, vol. 20, No. 8, Aug. 2011, pp. 2378-2386.
Richard Zhang, "The Unreasonable Effectiveness of Deep Features as a Perceptual Metric", in Proceedings of the IEEE Conference on Computer Vision and Pattern Recognition, 2018, pp. 586-595.
Unknown, "Compression Techniques", Retrieved from https://developers.google.com/speed/webp/docs/compression on Jun. 23, 2021, pp. 1-8.
Unknown, "A new image format for the Web", Retrieved from https://developers.google.com/speed/webp on Jun. 23, 2021, pp. 1-2.
Johannes Balle, et al., "End-to-End Optimized Image Compression", arXiv:1611.01704v3, Mar. 3, 2017, pp. 1-27.
Felix-Antoine Fortin, et al., "DEAP: Evolutionary Algorithms Made Easy", Journal of Machine Learning Research 13, 2012, pp. 2171-2175.
Hans-Georg Beyer, et al., "Evolutionary strategies—a comprehensive introduction", Natural Computing 1.1, 2002, pp. 1-50.
Kannan Ramchandran, et al., "Rate-Distortion Optimal Fast Thresholding with Complete JPEG/MPEG Decoder Compatibility", IEEE Transactions on Image Processing, vol. 2, No. 5, Sep. 1994, pp. 700-704.
Philipp Klaus Krause, "ftc—Floating Precision Texture Compression", Computers Graphics 34.5, 2010, pp. 594-601.
Melanie Mitchell, "An Introduction to Genetic Algorithms", A Bradford Book, The MIT Press, Fifth Printing 1999, pp. 1-162.
MMajid Rabbani, et al., "An overview of the JPEG 2000 still image compression standard", Signal Processing Image Communication, ELSEVIER, 2002, pp. 3-48.
Hamid Rahim Sheikh, et al., "A Statistical Evaluation of Recent Full Reference Image Quality Assessment Algorithms", IEEE Transaction of Image Processing, Draft, Mar. 18, 2006, pp. 1-23.
Jon Sneyers, Detecting the psychovisual impact of compression related artifacts using SSIMULACRA, Retrieved from https://cloudinary.com/blog/detecting_the_psychovisual_impact_of_compression_related_artifacts_using_ssimulacra, 2017, Online Accessed Nov. 30, 2018, Retrieved on Jun. 23, 2021, pp. 1-17.
Gregory K. Wallace, et al., "The JPEG Still Picture Compression Standard", IEEE Transactions on Consumer Electronics 38.1, 1992, pp. 1-17.
U.S. Appl. No. 16/875,884, filed May 15, 2020, Luitpold Staudigl, et al.

* cited by examiner

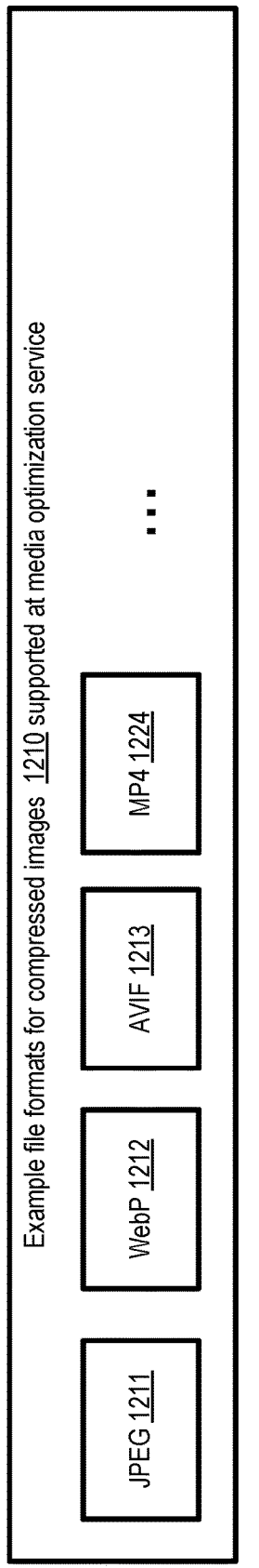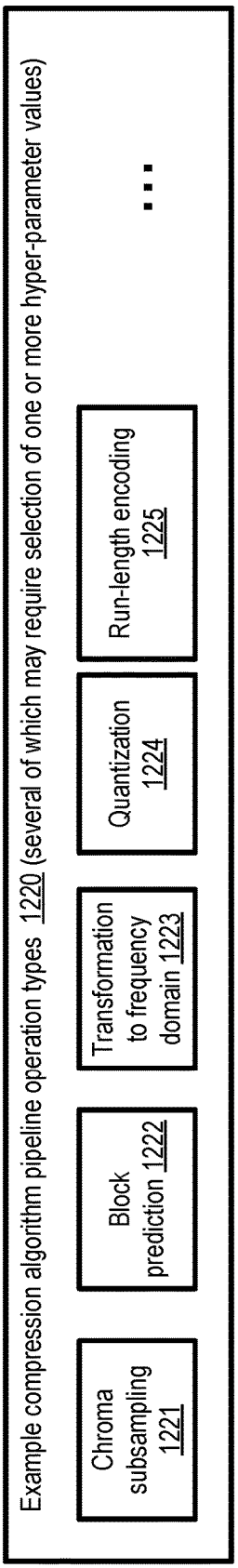
FIG. 12

For a representative set of images presented to viewers in a given context (e.g., for an e-retail web site), tune a compression algorithm (e.g., using the iterative evolutionary methodology) and store the tuned hyper-parameter values as a default hyper-parameter set HS-default   1701

↓

Identify one or more important classes of images of the given context (e.g., for the e-retail web site, class C1 may include images of electronic appliances, C2 may represent watches, C3 may represent shoes) using clustering machine learning algorithms   1704

↓

For each class of image, tune hyper-parameters of the compression algorithm separately, e.g., using iterative evolutionary algorithms, to obtain class-specific tuned hyper-parameter sets HS-C1, HS-C2, ...   1707

↓

When a given image is to be presented to a viewer, determine whether the image belongs to a class for which class-specific hyper-parameter combinations have been identified; if so, use the class-specific values, otherwise use HS-default; the presentation of the images may include the transmission of class-specific data for use in the de-compression (e.g., class-specific quantization tables)   1710

*FIG. 17*

PERCEIVED MEDIA OBJECT QUALITY PREDICTION USING ADVERSARIAL ANNOTATIONS FOR TRAINING AND MULTIPLE-ALGORITHM SCORES AS INPUT

BACKGROUND

Many companies and other organizations provide access to their services and products to customers over networks such as the public Internet. In some cases, substantial amounts of media content, such as still images, video or audio may be transferred by such entities to their end users. For example, content providers may enable users to download electronic versions of books and magazines, listen to downloaded or streaming versions of music and films, and so on. E-retail enterprises may enable clients to view images of products before making purchasing decisions, while real-estate agents, renters, travel services and the like may provide photographs and/or videos of accommodations to their end customers. An Internet-scale e-retail enterprise may provide millions or even billions of images to clients every day.

The quality of the images, videos, or audios, as perceived by the end users, may sometimes have a significant impact on whether the end users decide to engage further with the organization presenting the data: e.g., whether a given product is purchased from an e-retail web site, whether a given hotel room or bed-and-breakfast is reserved by a vacationer, and so on. Thus, from the service providing organization's perspective, providing media that looks good (and in cases where audio is involved, sounds good) may be critical to the success of the service being provided.

To provide the best possible experience for the end user, uncompressed or original versions of the available media objects (image files, audio files, video files, etc.) could of course be presented, at least in theory. However, this approach may be impractical in several ways. First, it may consume very high amounts of network bandwidth. Second, the delays experienced by users between the times that they request a media object and the time that the media object is displayed may become excessive. In order to avoid such problems, compression techniques are typically used: the media objects are compressed at the sending organization (which can involve the loss of some information from the original objects), transferred in compressed form over the network, and de-compressed at the receiving device before being presented to the end customer.

Because of the loss of information involved in the process, the version of the media object presented to the end customer may typically be somewhat degraded relative to the original: that is, if an end customer were given the opportunity to compare the original versus the presented version, the end customer may at least in some cases consider the presented version to be somewhat worse than the original. The extent of the perceived degradation depends on various factors, including the particular compression technique used. Unfortunately, quantifiable physical differences between the original and compressed versions of the media objects are sometimes insufficient to accurately predict perceived degradation in quality. Numerous compression algorithms, some with very large numbers of tunable hyper-parameters, have been developed over the years for various kinds of media. Predicting the extent of the perceived degradation for various compression schemes, and using such predictions to tune compression algorithms for large-scale presentation of media objects, remain non-trivial technical challenges.

BRIEF DESCRIPTION OF DRAWINGS

FIG. 12 illustrates example compressed image file formats and compression algorithm sub-operations, according to at least some embodiments.

FIG. 17 is a flow diagram illustrating aspects of a technique in which image class-specific tuning of compression algorithms may be conducted, according to at least some embodiments.

Figure 1:
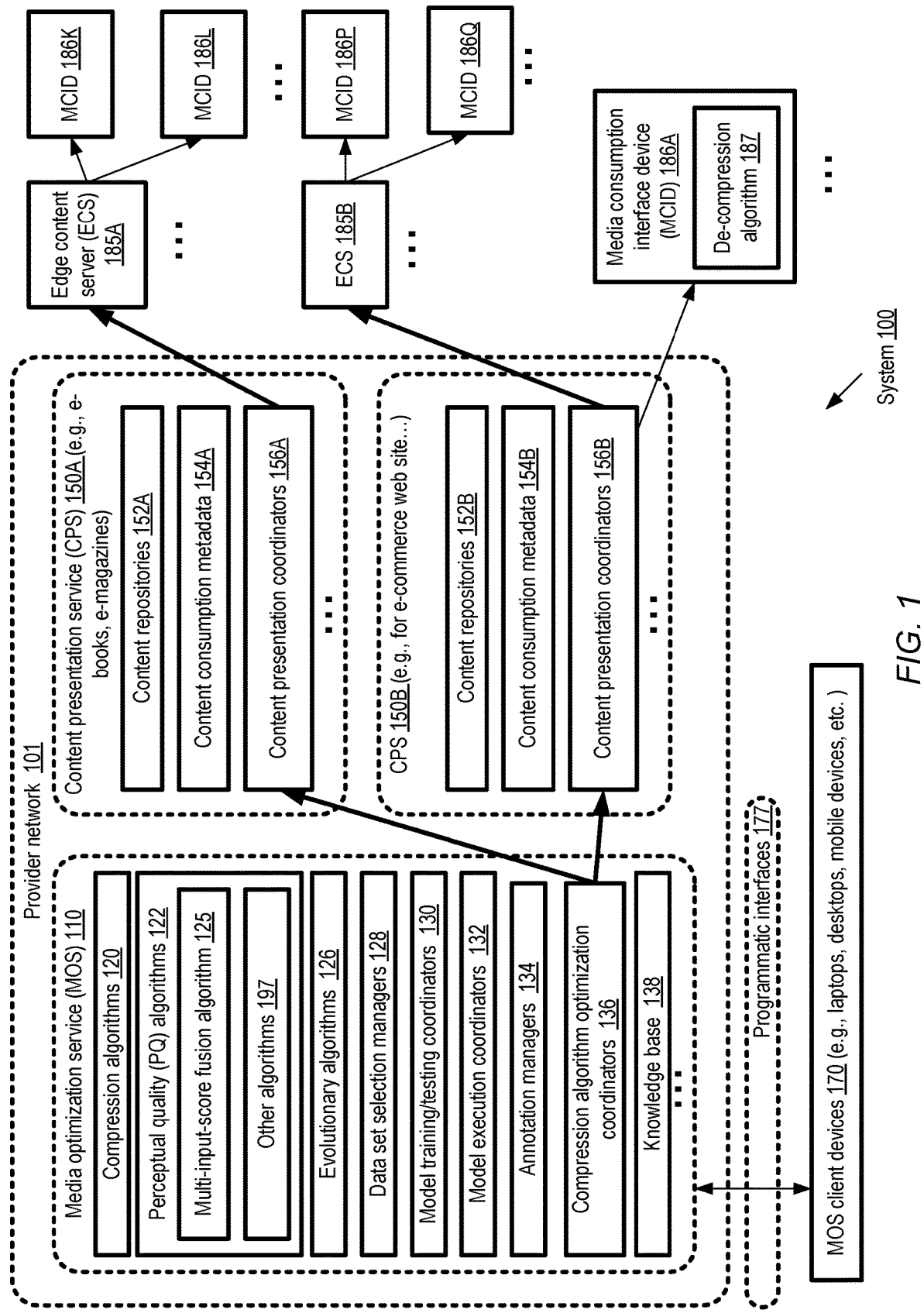
FIG. 1 illustrates an example system environment in which a network-accessible service for optimizing the process of compressing media content for over-the-network presentation may be implemented, according to at least some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and apparatus for enhanced prediction of perceived quality of compressed media objects such as images, as well as efficient iterative techniques for optimizing compression algorithms used for presenting such media objects to media consumers. According to at least some embodiments, a network-accessible service referred to as a media optimization service (MOS) may be set up at a provider network or cloud computing environment to implement such techniques on behalf of clients of the service.

At a high level, one of the proposed techniques comprises the intelligent selection of examples (e.g., image sets which meet certain criteria with respect to the divergence of quality scores obtained using pre-existing quality degradation prediction techniques) for training a relatively simple machine learning model which uses multiple quality scores as input for a given training example, with each of the scores being obtained from a respective existing perceived quality degradation algorithm. The trained machine learning model may, in effect, combine the strengths of each of the existing algorithms used for its input, while avoiding some of the weaknesses of such existing algorithms by learning about subtle perceived quality differences or "edge cases" as a result of the intelligent selection of the training examples. After the model is trained, it may predict perceived image quality degradations more accurately, and in a more generalizable way, for various compression algorithms and hyper-parameter combinations than the pre-existing techniques. The terminology "PQ algorithm" (perceptual quality algorithms or perceived quality algorithms) may be used herein generically to refer to algorithms that predict perceived media quality degradations, e.g., by generating numerical "PQ scores" indicative of the predicted extent of the human-perceived degradation of a given compressed media object relative to a reference or baseline version of the same media object, or the absolute perceived quality of a media object where the reference version is unknown. Generally speaking, PQ algorithms may be used for a variety of types of media (e.g., audio and video in addition to still images) in various embodiments. The reference version may be an uncompressed version of the object in some cases, or a different compressed version generated using a default or reference compression algorithm, depending on the scenario in which the PQ algorithm is being used in various embodiments. PQ algorithms may be referred to as PQ "metrics" and/or as "perceived quality" algorithms in some embodiments, and reference versions may also be referred to as "original" or "baseline" versions in some embodiments. In the above-described methodology, a new PQ algorithm which consumes or "fuses" scores generated by other PQ algorithms (for specially-selected training examples) as input, and does not have to be provided the actual media objects being compared as input, is trained and deployed in various embodiments. As such, the new PQ algorithm may be referred to as a "fusion" algorithm in at least some embodiments, and the underlying machine learning model may be referred to as a "fusion" model. Results obtained using the fusion PQ algorithm may be used, for example, to make better tradeoffs with regard to compression approaches (including tradeoffs between file sizes and specific hyper-parameter combinations of the compression algorithms while meeting quality requirements) to be employed for presenting content items to content consumers in various embodiments, and/or to select particular compressed images to be presented to the content consumers from among a set of available compressed images.

A second proposed technique utilizes an iterative evolutionary approach towards selecting optimized values of hyper-parameters for image compression algorithms in at least some embodiments. This second technique resolves the "chicken-and-egg" problem confronting attempts to tune compression algorithms: namely, that in order to tune a compression algorithm in an automated manner, one usually needs a sufficiently-tuned PQ algorithm (e.g., to judge the merits of respective compressed versions of a given image), but the process of tuning the PQ algorithm using traditional approaches may itself require using a sufficiently-tuned compression algorithm (e.g., to enable useful comparisons of different combinations of PQ algorithm hyper-parameters relative to one another). In the proposed approach, a number of optimization iterations, each involving several stages, may be run in various embodiments. In a first stage of a given optimization iteration, a PQ algorithm is first calibrated or tuned independently of any particular combination of compression hyper-parameters, e.g., using data sets obtained from human annotators and a selected optimization strategy, such as an evolutionary methodology based on a first set of tradeoffs between exploration and exploitation and a first fitness function. Then, in a second stage of the same optimization iteration, the tuned PQ algorithm is used to generate PQ scores for images produced using a variety of compression hyper-parameter combinations. Another optimization strategy (e.g., another evolutionary methodology which uses a different set of exploration-versus-exploitation tradeoffs and a different fitness function) in which such scores are compared with one another may then be used to select better-performing compression algorithm hyper-parameter combinations in various embodiments. In at least some embodiments, a third stage of a given optimization iteration may involve evaluating the "fittest" of the hyper-parameter combinations identified for the compression algorithm using human annotators and new image sets which have not been used thus far in any of the iterations, along with statistical techniques which address potential biases in the evaluation. If the result of the evaluation stage suggest that additional iterations are to be performed, some of the annotations produced in the evaluation stage may be used in the PQ algorithm tuning stage of the next iteration in at least some embodiments. Tuned versions of the compression algorithms obtained using the iterative multi-stage approach outlined above may be deployed for content presentation in various embodiments, providing compressed versions of the images which meet selected quality criteria while ensuring that the file sizes of the compressed versions remain within reasonable limits.

As one skilled in the art will appreciate in light of this disclosure, certain embodiments may be capable of achieving various advantages, including some or all of the following: (a) reducing the overall amount of network, computing, and/or storage resources which have to be used to provide media objects such as images to consumers such as e-retail website customers, e-book readers, etc., and/or (b) improving the user experience of such media consumers, e.g., by reducing the latencies or delays experienced by the consumers for content item presentation.

According to some embodiments, a system may comprise one or more computing devices. The computing devices may include instructions that upon execution on or across one or more processors of the computing devices cause the computing devices to identify, for inclusion in a group of images used for training a machine learning model, a first plurality of image tuples which satisfy an algorithm-to-algorithm divergence threshold. Individual image tuples may comprise a reference image, a first compressed version of the reference image, and a second compressed version of the reference image. The image tuples may be selected or filtered from an available larger collection of image tuples in various embodiments. The image tuples may be selected/filtered such that a difference between (a) a first quality degradation score produced by a first PQ algorithm of a first set of PQ algorithms for one or more of the compressed versions relative to the reference image, and (b) a second quality degradation score produced by a second PQ algorithm of the first set for the one or more of the compressed versions relative to the reference image exceeds the divergence threshold. PQ algorithms may differ in their respective judgements/predictions of quality degradation for the same image pair, for example, because the underlying assumptions of the PQ algorithms regarding the important features of images may differ, because their underlying assumptions about the human visual system may differ, and so on. The intuition behind using algorithm-to-algorithm divergence as a factor to select training examples is that such divergent images, when evaluated for quality degradations by human annotators, may provide examples of subtle differences in quality that would be valuable for the machine learning model to learn, and that such subtle differences may not be captured sufficiently by the existing set of disagreeing PQ algorithms.

It may be helpful at this stage to consider a concrete example of algorithm-to-algorithm divergence. Consider a simplified scenario in which a PQ score is a real number between 0 and 1, with 0 representing no human-perceived degradation (as predicted by a PQ algorithm) and 1 representing a very high level of human-perceived degradation. Consider two image tuples: tuples T1 and T2. T1 comprises a reference image I1 and compressed versions C1'I1 and C2'I1 of I1. T2 comprises a reference image I2 and compressed versions C1'I2 and C2'I2 of I2. Assume further that a set of PQ algorithms PQ1 and PQ2 are used to identify image tuples which satisfy a divergence threshold. PQ1 generates a PQ score of 0.2 for the image pair (I1, C1'I1) of T1 and a PQ score of 0.3 for the image pair (I1, C2'I1) of T1. PQ2 generates a PQ score of 0.22 for the image pair (I1, C1'I1) of T1 and a PQ score of 0.27 for the image pair (I1, C2'I1) of T1. Based on these example scores, the mean absolute difference between the scores produced by the two algorithms PQ1 and PQ2 for the image pairs of T1 is quite small: 0.015, the mean of |0.2−0.22|=0.02 for (I1, C1'I1), and |0.3−0.27|=0.03 for (I1, C2'I1). Assume that PQ1 generates a PQ score of 0.4 for the image pair (I2, C1'I2) of T1 and a PQ score of 0.7 for the image pair (I2, C2'I2) of T2 while PQ2 generates a PQ score of 0.2 for the image pair (I2, C1'I2) of T2 and a PQ score of 0.25 for the image pair (I2, C2'I2) of T2. The mean absolute difference between the scores produced by the two algorithms PQ1 and PQ2 for the image pairs of T2 is larger than for the image pairs of T1: 0.325, the mean of |0.4−0.2|=0.2 for (I2, C1'I2), and |0.7−0.25|=0.45 for (I1, C2'I1). If the divergence criteria for selecting image tuples is based on such mean absolute difference measures, and the divergence threshold is set to a value such as 0.25, then T1 would not be selected (as the divergence 0.015 in its scores would not be as high as the threshold 0.25), while T2 would be selected (as the divergence 0.325 in its scores is higher than the threshold 0.25). Note that in practice, other measures than mean absolute differences may be used in at least some embodiments, and/or the number of PQ algorithms whose scores are compared with one another may be higher than two. In some cases, for example, the PQ score divergence for a single compressed image of a tuple relative to the reference image of the tuple may be sufficient to designate an image tuple as meeting the algorithm-to-algorithm divergence criteria, even if the PQ scores for the other image of the tuple do not vary much from one algorithm to another. The image tuples or pairs that are identified using such criteria may be referred to as "adversarial" images in some embodiments, as they represent examples of disagreement among existing PQ algorithms. The set of existing PQ algorithms used to identify adversarial images may be chosen based on a variety of factors in different embodiments, e.g., based on a knowledge base which contains entries indicating which existing PQ algorithms have proven individually successful for various image presentation scenarios in the past, based on input from clients of a media optimization service, based on relative resource usage metrics of the PQ algorithms, and so on.

After the adversarial image tuples are identified using a first selected set of PQ algorithms, respective labels may be obtained for the adversarial image tuples from a group of one or more annotators in various embodiments. A label for a given image tuple may, for example, indicate which compressed version of the given image tuple is perceived to be more similar to the reference image of the given image tuple by the human annotators. This process of, in effect, resolving the differences between the disagreeing PQ algorithms using human judgements may be referred to as "adversarial" annotation in some embodiments.

In at least some embodiments, another group of image tuples selected from the image collection may be automatically annotated for training the machine learning model. Such auto-labeling may be performed using PQ scores generated for the image tuples by a second set of PQ algorithms, instead of utilizing human annotators. This second group of image tuples may be referred to as "non-adversarial" images in at least some embodiments, as they may be selected for reasons other than divergence between PQ algorithms' scores. Such reasons may, for example, include (a) that the PQ scores generated for a given image tuple by the respective PQ algorithms of the second set meet a high level of concordance or agreement among themselves, and/or (b) that the compressed images of the tuples represent common or well-known examples of compression-related artifacts (e.g., introduced spurious edges, reduction of contrast, etc.) which are expected to be noticeable to humans. The intuition behind identifying the non-adversarial images is that such images, when use to generate training records for the machine learning model, may provide examples of more obvious differences in quality that would be obtained from the adversarial images alone, and may thus strengthen the ability of the model to respond to straightforward quality degradation scenarios (and not just to respond to subtle differences learned from the adversarial examples).

The two sets of labeled image tuples (adversarial and non-adversarial) may be combined into a single labeled image data set in some embodiments. However, as discussed below, in at least one embodiment the two sets may be used separately for respective stages of a multi-stage training procedure used for the machine learning model.

Using a third set of PQ algorithms, a plurality of pairs of training records may be generated for the machine learning model from the labeled image data set in some embodiments. A given pair of training records may comprise a first record and a second record, each comprising multiple PQ scores for an image pair comprising one of the compressed versions of an image tuple. The first record may include, in at least some embodiments, (a) a plurality of quality degradation scores for a first compressed version of a particular reference image of the labeled image data set, obtained using respective PQ algorithms of the third set, and (b) the particular label which was stored in the labeled image data set for the image tuple of which the first compressed version is a member. Similarly, the second record may include (a) a plurality of quality degradation scores for a second compressed version of the particular reference image, obtained using the same PQ algorithms of the third set, and (b) the particular label which was stored in the labeled image data set for the image tuple of which the second compressed version is a member. Thus, for example, if the third set of PQ algorithms comprises PQ1, PQ2 and PQ3, and the PQ score generated by a given PQ algorithm PQi for an image pair (original image I, compressed image C) is represented as Score(PQi, I, C), one record R1 of a training record pair (R1, R2) for a labeled image tuple C1'I1, C2'I1, label L1) may comprise [Score(PQ1, I1, C1'I1), Score(PQ2, I1, C1'I1), Score(PQ3, I1, C1'I1), L1]. The other record R2 may comprise [Score(PQ1, I1, C2'I1), Score(PQ2, I1, C2'I1), Score(PQ3, C2'I1), L1]. In some implementations, because the label information is in some sense common to both image pairs of a record pair, it may not have to be stored separately for each record of the pair: for example, a record pair may be provided as input to the machine learning model in a concatenated format similar to [Score(PQ1, I1, C1'I1), Score(PQ2, C1'I1), Score(PQ3, I1, C1'I1), Score(PQ1, I1, C2'I1), Score(PQ2, I1, C2'I1), Score(PQ3, I1, C2'I1), L1].

In at least some embodiments, the record pairs may be used to train a machine learning model to predict, for a post-training input record comprising a plurality of quality degradation scores for a particular compressed version of an image, an output quality degradation score for the particular compressed version. Note that such a model may not have to be provided input representing the contents of the images themselves; instead, it may only have to be provided scores generated by other PQ algorithms as input. The model, which may be referred to as a fusion model as mentioned earlier because it fuses or combines information from pre-existing PQ algorithms, may comprise a symmetric neural network in some embodiments, in which learned parameters are shared between a pair of sub-models which analyze respective records of a record pair. Although the fusion model technique is described above as using tuples comprising three images (a reference image and a pair of compressed images) at several stages, in at least some embodiments individual images or image pairs may be used instead in one or more of the stages of the algorithm. Thus, for example, to identify images for which different PQ algorithms tend to produce divergent PQ scores, such scores may be obtained from the different PQ algorithms for one compressed image at a time (for example, where no reference is available), or for pairs of images (a reference image and a compressed version) at a time.

Pre-existing PQ algorithms may thus be used at several stages of the training procedure of the fusion model described above: (a) for the selection of adversarial image sets, (b) for the selection and labeling of non-adversarial image sets, and (c) to produce the scores included in the training records for the fusion model. In some embodiments, the same combination of PQ algorithms may be used for each of the three stages; in other embodiments, at least one of the PQ algorithms used for one of the stages may not necessarily be used for one or both of the other stages. Some PQ algorithms may be chosen for one or more stages of the training procedure based on their respective resource usage requirements/metrics: e.g., a PQ algorithm that requires fewer computation cycles or a smaller amount of memory than other PQ algorithms may be selected in preference to the others, as long as the quality of the fusion model is not affected substantially. In some embodiments, a pre-existing PQ algorithm used for one of the stages may also comprise a machine learning model. In some cases, a given pre-existing PQ algorithm may produce scores at several different granularities or at several different intermediate or internal layers: for example, respective intermediate scores generated for different scales or hierarchical representations of a compressed image may be used to produce a final PQ score. In at least one embodiment, instead of using just the final PQ scores generated by such an algorithm to populate the training records of the machine learning model, one or more of the internal or intermediate (non-final) scores may be used to populate the training records.

In at least some embodiments, as mentioned above, a fusion model of the kind described above may be trained and/or executed at a media optimization service (MOS) of a provider network or cloud computing environment. Such an MOS may implement a set of programmatic interfaces, such as a web-based console, command-line tools, application programming interfaces (APIs), graphical user interfaces and the like, which can be used by MOS clients to submit various types of requests and receive corresponding responses. For example, an MOS client may use such programmatic interfaces to specify pre-existing PQ algorithms to be used for various stages of the training of a fusion model, to specify image collections to be used for the training, and so on.

An MOS may support compression and/or other types of processing on media objects such as images, videos, audios, and the like in various file formats, for presentation of the media objects to clients or end users in many different contexts. For example, one subset of clients may view at least some media objects using high-resolution client-side devices with substantial computing power available at the client-side devices for de-compression and high network bandwidth available for the media objects, while another subset of clients may view at least some media objects using relatively low-compute-power, lower-resolution client-side devices and tighter bandwidth constraints. The presentation contexts may also differ in the kinds of PQ algorithms which can be used to predict the perceived degradations of compressed versions of media objects. An MOS may be used to tailor or tune compression algorithms that can be used for a variety of presentation contexts and/or media formats in at least some embodiments.

According to some embodiments, a system may comprise one or more computing devices, e.g., at an MOS of a provider network. The computing devices may include instructions that upon execution on or across one or more processors of the computing devices cause the one or more computing devices to obtain an indication, at a media optimization service, of one or more properties of an image presentation context, including (a) an image file format and (b) a type of interface used to present images to viewers. Based at least in part on the properties of the presentation context, in at least some embodiments one or more PQ algorithms to be used to tune hyper-parameter values of one or more compression algorithms to be used for the context may be selected.

A plurality of optimization iterations may be performed using the computing devices in various embodiments. A given optimization iteration may comprise at the least the following stages in some embodiments. In a first stage, one or more hyper-parameters of a PQ algorithm may be tuned using an evolutionary algorithm with a first fitness function and an annotated input data set comprising a first plurality of image pairs represented in the image file format of the presentation context. Respective annotations for at least some image pairs of the input data set may have been generated in a compression quality evaluation test stage of an earlier optimization iteration in some embodiments.

In a second stage of the optimization iteration, one or more hyper-parameters of a compression algorithm selected for the image presentation context may also be tuned using an evolutionary algorithm in some embodiments. The fitness function and the input data set used for this stage may differ from the fitness function and the input data set used for the first stage in various embodiments. For the tuning of the selected compression algorithm, the input data set may comprise respective perceptual quality scores, generated using a tuned version of the PQ algorithm obtained in the first stag, for a second plurality of image pairs. A given image pair for which scores are generated using the tuned PQ algorithm may include (a) an image compressed using a particular hyper-parameter combination of the selected compression algorithm and (b) an image compressed using a reference image compression algorithm.

According to at least some embodiments, a third stage of the optimization iteration may comprise conducting a compression quality evaluation test on a set of images generated using the tuned version of the compression algorithm obtained in the second stage of the iteration. The compression algorithm may be evaluated using a new data set which has not been used earlier in the optimization iterations, for which labels may be obtained from a set of annotators. A result of the compression quality evaluation test may be used to determine whether additional optimization iterations are to be performed; if so, some of the labeled data generated in the third stage of the current iteration may be employed in various embodiments to tune a PQ algorithm in the first stage of the next iteration. If no additional iterations are necessary, e.g., if the compression algorithm has been tuned sufficiently to satisfy a pre-selected quality criterion, the iterative optimization procedure may be terminated. Images encoded using a tuned version of the compression algorithm (obtained, for example, from the final optimization iteration) may be presented via the interfaces used for the presentation context for which the algorithm was optimized.

In at least some embodiments, a client of the MOS may specify various constraints to be used to optimize the compression algorithms—e.g., the kinds of decoders or de-compression algorithms expected to be available to consumers of the images may be indicated by a client, limits on the amount of CPU or time that can be used for compression or de-compression may be indicated, and so on. In such embodiments, the constraints may be used to guide the implementation of one or more of the stages of the iterative optimization procedure—e.g., only certain combinations of compression hyper-parameters compatible with the expected decompressors may be considered, or the amount of computing resources provided for the compression algorithm may be limited, and so on.

Any of a number of approaches may be taken with respect to the tradeoffs between (a) compressed image size and (b) the perceptual quality of the compressed images in different embodiments. In one embodiment, for example, perceptual quality may be maximized while satisfying a compressed image file size constraint. In another embodiment, the compressed image file size may be minimized while satisfying a perceptual quality threshold constraint. A combination of both these approaches may be used in some embodiments. Broadly speaking, the penalty function used for the optimization tries to minimize/maximize the objective while increasing/decreasing the penalty if constraints are violated. Violation of the constraints may be punished harshly (e.g., by rejecting the solution entirely) in some embodiments; in other embodiments in which a less harsh (or "fuzzy") approach is used, some violations of thresholds may be permitted. As mentioned earlier, in some embodiments, evolutionary algorithms may be used in the first and second stages (for tuning the PQ algorithms and for tuning the compression algorithms, respectively) of the optimization iterations; non-evolutionary optimization strategies may be used in at least one of the stages in other embodiments. In some embodiments in which evolutionary algorithms are used in both stages, the algorithms for the first and second stages may differ from one another in several ways. A fitness function used for the evolutionary algorithm of the first stage may be based at least in part on a metric of disagreement between (a) intra-image-pair quality preferences indicated by one or more annotators and (b) corresponding intra-image-pair quality preferences generated by the PQ algorithm. A fitness function used for the evolutionary algorithm of the second stage may be based at least in part on the file sizes as well as the PQ scores of the compressed images being considered in some embodiments. Different tradeoffs between exploration (trying thus-far-untried values of hyper-parameters) and exploitation (re-using hyper-parameter values which have been identified as beneficial) may be used to select parameters of the evolutionary algorithms for the two stages in some embodiments.

In much of the remainder of this document, still images are used as the primary examples of the kinds of media objects which can benefit from fusion models and the iterative optimization methodology for compression algorithms. It is noted that in various embodiments, analogous techniques may be used with equal success to enhance predictions of the perceived quality of, and/or tune hyper-parameters of compression algorithms for, other types of media objects such as video and audio as well as (or instead of) still images.

Example System Environment

FIG. 1 illustrates an example system environment in which a network-accessible service for optimizing the process of compressing media content for over-the-network presentation may be implemented, according to at least some embodiments. As shown, system 100 may comprise various resources and artifacts of a provider network 101, including a media optimization service (MOS) 110 as well as several content presentation services (CPSs) such as 150A and 150B. Resources of the MOS 110 may be used to perform numerous types of tasks related to the optimized presentation of content, including the training and execution of machine learning models for prediction of perceived quality of compressed images as well as the tuning of compression algorithms in the depicted embodiment. A wide variety of compression algorithms 120 may be supported by the MOS 110 in the depicted embodiment, and tuned/optimized for various media presentation contexts on behalf of clients. Numerous perceptual quality algorithms 122 may also be supported by the MOS 110, and executed on behalf of MOS clients and/or to optimize the compression algorithms 120. Other services implemented at the provider network 101, including CPSs 150, may utilize results and recommendations provided by the MOS 110, e.g., to set the combinations of hyper-parameter values to be used with a particular compression algorithm for various types of media objects that are eventually presented to media consumption interface devices (MCIDs) 186.

The term "provider network" (sometimes simply called a "cloud") refers to a large pool of network-accessible computing resources (such as compute, storage, and networking resources, applications, and services), which may be virtualized or bare-metal. The cloud can provide convenient, on-demand network access to a shared pool of configurable computing resources that can be programmatically provisioned and released in response to customer commands. These resources can be dynamically provisioned and reconfigured to adjust to variable load. The resources of a provider network may in some cases be distributed across multiple data centers, which in turn may be distributed among numerous geographical regions (e.g., with each region corresponding to one or more cities, states or countries). For example, a cloud provider network can be formed as a number of regions, where a region is a geographical area in which the cloud provider clusters data centers. Each region can include two or more availability zones connected to one another via a private high speed network, for example a fiber communication connection. An availability zone refers to an isolated failure domain including one or more data center facilities with separate power, separate networking, and separate cooling from those in another availability zone. Preferably, availability zones within a region are positioned far enough away from one other that the same natural disaster should not take more than one availability zone offline at the same time. Customers can connect to availability zones of the cloud provider network via a publicly accessible network (e.g., the Internet or a cellular communication network). A provider network may include a number of network-accessible services, such as a virtualized computing service (VCS), one or more storage services, database services, media optimization services such as MOS 110, CPSs 150 and the like. Some provider network services, such as MOS 110 and/or CPSs 150, may be built using other services such as a VCS in the depicted embodiment—e.g., compute instances of the VCS may be used to implement optimization techniques and/or fusion model training of the MOS, or for run-time content presentation coordinators such as 156A and 156B of the CPSs. A VCS may also be referred to as an elastic compute service, virtual machines service, computing cloud service, compute engine, and/or cloud compute in various implementations.

The MOS 110 may implement a set of programmatic interfaces 177 in the embodiment shown in FIG. 1. Interfaces 177 may include, for example, a set of APIs, one or more web-based consoles, command-line tools, graphical user interfaces and the like. Clients of the MOS 110 may submit various types of requests and messages to the MOS from client devices 170 (e.g., laptops, desktops, mobile computing devices and the like), and receive corresponding responses.

An MOS client may use programmatic interfaces 177 to submit a request to train a machine learning model to generate PQ predictions in some embodiments. In response, a machine learning model which uses a multiple-quality-score-input fusion algorithm 125 may be generated by model training and testing coordinators 132 of the MOS 110. In at least some embodiments, the machine learning model, which may be referred to as a fusion model, may comprise a symmetric neural network as discussed below in further detail in the context of FIG. 7. The process of preparing a training data set for the fusion model may comprise data set selection managers 128 identifying, from an image corpus indicated by the client, a set of image tuples for which selected other PQ algorithms 197 generate PQ scores which meet a divergence threshold. Labels for such adversarial or divergent image tuples may be obtained from a set of human annotators in at least some embodiments. The MOS 110 may include a set of annotation managers 134 which are responsible for selecting/identifying an initial set of human annotators, e.g., using a crowdsourcing service of the provider network 101 and/or a list of image quality specialists maintained in knowledge base 138. In addition, in at least some embodiments, a set of non-adversarial image tuples identified by the data set selection managers 128 may be labeled automatically by the annotation managers 134 using a selected set of the other PQ algorithms 197, and added to the labeled adversarial image tuples to form a labeled image data set. Training records for the fusion model 125, comprising respective PQ scores generated using a plurality of other PQ algorithms 197 may be obtained by the training/testing coordinators 130. The fusion model may then be trained using the training records, and executed as needed by model execution coordinators 132 (e.g., in response to client requests for PQ scores for specified image pairs, or as part of iterative optimization of compression algorithms 120).

In response to compression algorithm optimization requests submitted by MOS clients via interfaces 177, an iterative evolutionary optimization technique may be implemented by optimization coordinators. One or more PQ algorithms 122 (which in some cases may include the fusion algorithm 125) may be identified for an image presentation context indicated by the client. Image presentation contexts may differ from each other in properties such as the image file format being used, the kinds of consumption interface devices 186 expected to be used by the viewers, constraints on the delay that can be tolerated for the display of a requested image, and so on. One or more optimization iterations may be conducted for the compression algorithm, with each iteration comprising several stages. In the first stage, a selected PQ algorithm 122 may be tuned (i.e., hyper-parameters of the PQ algorithm may be selected) using human-annotated image sets and an evolutionary algorithm 126 with a first fitness function in the depicted embodiment. In a second stage, the tuned PQ algorithm may be used to generate scores for images compressed using a variety of compression algorithm hyper-parameter combinations, and an evolutionary algorithm 126 may again be used to tune the compression algorithm, e.g., with a fitness function that takes the PQ scores as well as compressed image file size into account. In a final stage of the optimization iteration, the tuned compression algorithm may be evaluated, using a new set of human-annotated image sets. Statistical techniques may be used to compensate for biases of the annotators in the evaluation stage in at least some embodiments. If additional optimization iterations are required, the PQ algorithm tuning stage of the next iteration may make use of some of the labeled image sets used in the evaluation stage of the current iteration in at least some embodiments.

A given content presentation service (CPS) such as 150A or 150B may present requested content, including media objects such as images, from content repositories 152 (e.g., 152A or 152B) to content consumers in the depicted embodiment. CPS 150A may, for example, present e-book or e-magazine content to its end users, while CPS 150B may provide images of products offered for sale by an e-retail organization. Information about the manner in which content is being consumed (e.g., properties such as screen size, screen resolution, compute capabilities, de-compression algorithms 187, etc.) of the media consumption interface devices (MCIDs) 186 being used) by end users may be stored on content consumption metadata 154A or 154B in some embodiments, and such metadata may be used to characterize the image presentation contexts for which compression algorithms are optimized. Recommendations about the tuned version of the compression algorithms (e.g., the best combination of hyper-parameter values that have been identified in the iterative optimization procedures described above for a given image presentation context) may be provided by compression algorithm optimization coordinators 136 to content presentation coordinators 156 (e.g., 156A or 156B) at the request of MOS clients in the depicted embodiment. The optimized settings of hyper-parameters may be used to present images and other content to end users, either directly from the CPS (as in the case of MCID 186A), or indirectly via edge content servers (ECSs) such as 185A or 185B in the depicted embodiment. In the indirect path, the content may be transmitted to the ECSs from the CPS, cached in at least some cases at the ECSs 185, and transmitted to the end users' MCIDs 186 as needed from the ECSs 185. Tuned versions of compression algorithms may be used for both steps of such indirect transfers in some embodiments: e.g., a first set of tuned hyper-parameter values identified at the MOS may be used to transfer content from a CPS to an ECS, and a different set of tuned hyper-parameter values identified at the MOS may be used to transfer content from an ECS to end-users' MCIDs. A wide variety of MCIDs 186 may be employed by content consumers in different embodiments—e.g., MCID 186K and 186P may comprise a tablet computing device, MCIDs 186L and 186A may each comprise a smart phone, MCID 186Q may comprise a laptop or a television, and so on.

Compression algorithm optimization coordinators 136, annotation managers 134, model training/testing coordinators 132, model execution coordinators 132, data set selection managers 128, and content presentation coordinators 156 may each be implemented using some combination of software and hardware of one or more computing devices in the depicted embodiment. Any of a wide variety of storage devices or storage services may be used to store data sets used at the MOS, content repositories 152, content consumption metadata 154, entries of knowledge base 138, as well as program code used to implement compression algorithms 120, PQ algorithms 122, and evolutionary algorithms 126 in various embodiments. Additional details regarding various aspects of the functionality of MOS 110 are provided below.

Example Factors Influencing Perceived Image Quality

Figure 2:
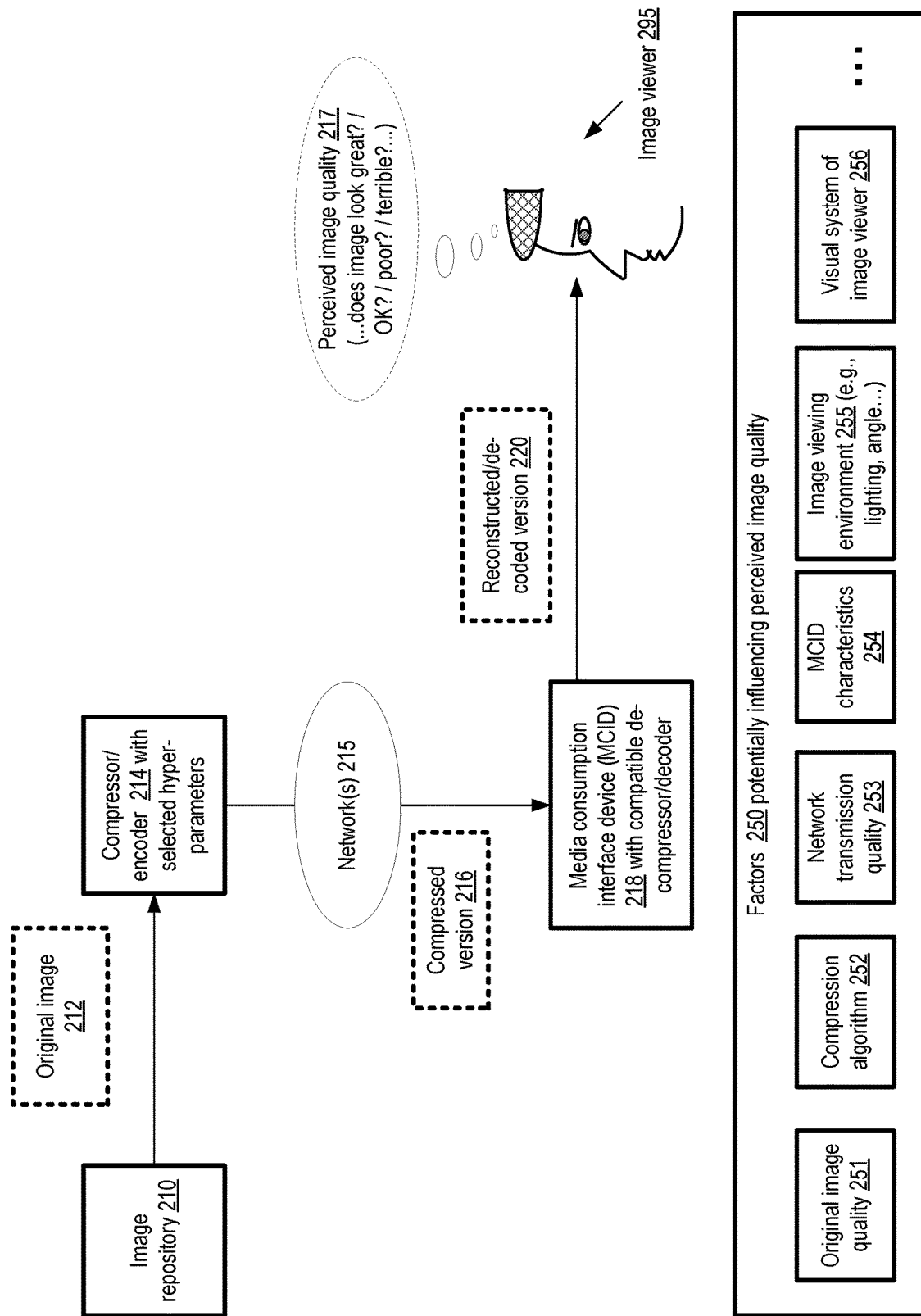
FIG. 2 illustrates example factors which may influence the perceived quality of a compressed image, according to at least some embodiments.

FIG. 2 illustrates example factors which may influence the perceived quality of a compressed image, according to at least some embodiments. Steps of an example workflow which may be implemented to present an image to an image viewer 295 are shown in the upper part of FIG. 2. An original (e.g., uncompressed) image 212 may be obtained from an image repository 210, and a compressor (also referred to as an encoder) may generate a compressed version 216 of the original image using selected hyper-parameter values of a compression algorithm (e.g., hyper-parameter values tuned using the iterative approach described above). The compressed version 216 may be transmitted via one or more network(s) 215 (e.g., the public Internet, and/or a private network) to a media consumption interface device (MCID) 218. The MCID 218 may comprise a de-compressor or decoder 218 compatible with the compressor/encoder 214 in various embodiments—that is, a de-compression algorithm that is able to process the compressed version to produce a reconstructed/decoded version 220 of the compressed image may be required at the MCID 218. The image viewer 295 may form an opinion of the quality 217 of the reconstructed version 220. For example, as shown, the image viewer may think that the image looks great, okay, poor or terrible. Such opinions are of course inherently subjective to some extent, and may this differ from one image viewer to another for the same compressed image, which makes the task of estimating perceived quality in an automated way even more difficult. Unfortunately, analysis of the physical differences (e.g., expressed as peak signal-to-noise ratio or PSNR) between the original and compressed images is often insufficient to accurately predict human-perceived degradation in quality. This is because relying on such physical differences does not take into account that (a) some physical differences may be imperceptible to a human in a given viewing environment and (b) approximately equal physical differences can sometimes produce very different visual effects/results.

Example factors 250 which can influence the perceived image quality 217 may include, among others, the original image quality 251, the compression algorithm 252 (including the hyper-parameters used), then network transmission quality 253, characteristics 254 of the MCID, the external environment 255 in which the image is viewed (such as the ambient light conditions, the angle at which the MCID is viewed, etc.), as well as the biological visual system of the image viewer 256 (the health of various parts of the eyes, etc.). Different PQ algorithms, which are intended to predict the extent of the perceived degradation (if any) in image quality relative to the original, may try to incorporate or model one or more of the factors 250 in various embodiments based on various assumptions regarding the relative importance of the factors, and/or by weighting physical differences by the predicted visibility of the physical differences to humans. For example, some PQ algorithms attempt to model properties of human visual systems and how they are affected by various properties of a reconstructed compressed image; others may attempt to capture the most salient or visible features of images and how these features are affected by the compression algorithms' hyper-parameters. In general, it may be difficult for pre-existing PQ algorithms to generalize their predictions to take all the different factors potentially impacting image quality perceptions into account; some existing PQ algorithms may thus work best in specific image presentation contexts.

Figure 3:
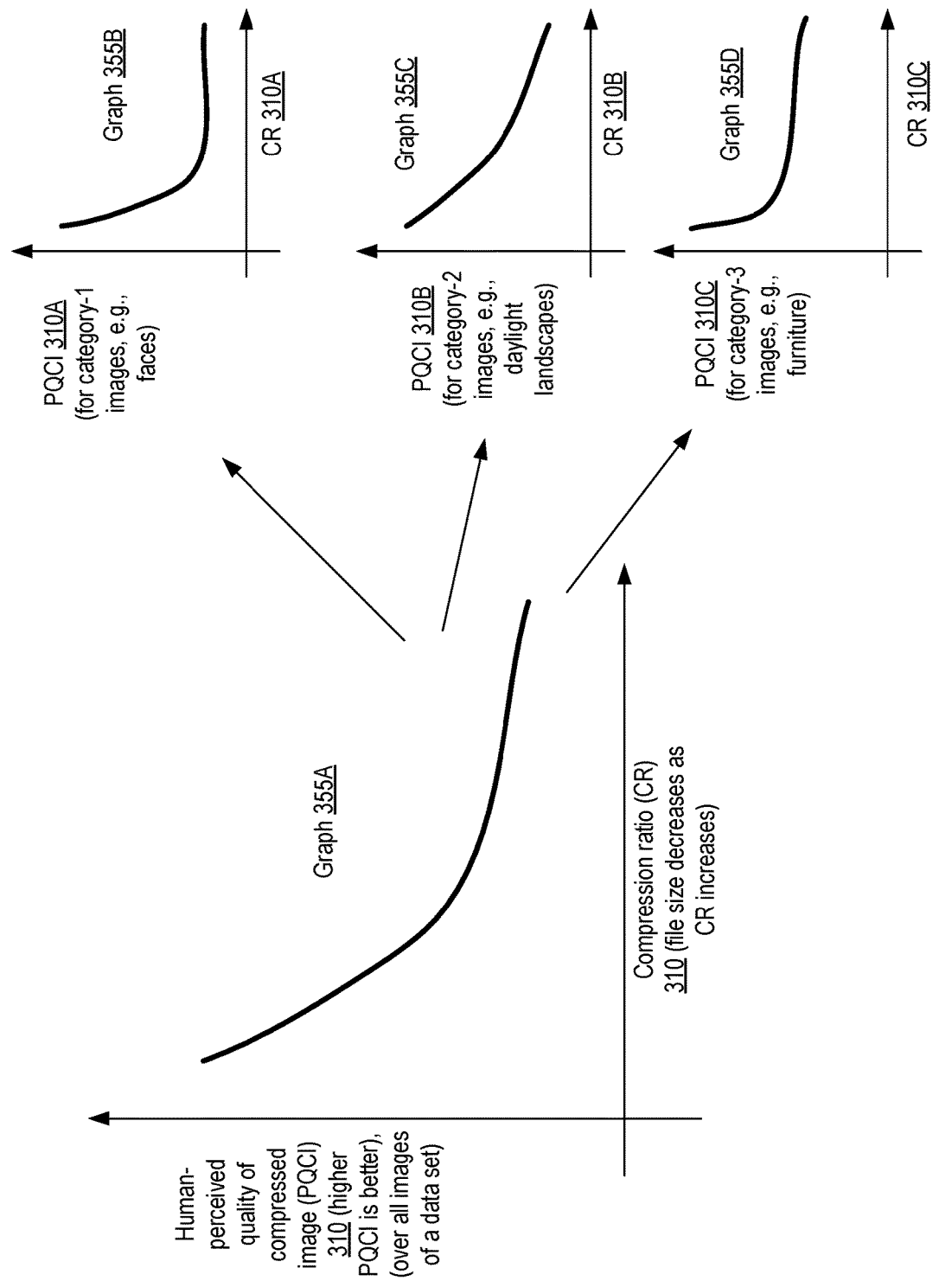
FIG. 3 illustrates example variations in the relationship between image compression ratios and perceived quality of the images, according to at least some embodiments.

Variation in Relationships Between Compression Ratios and Perceived Image Quality FIG. 3 illustrates example variations in the relationship between image compression ratios and perceived quality of the images, according to at least some embodiments. The compression ratio (CR) of a file, as used in the context of FIG. 3, is the ratio of the size of an uncompressed or reference version of the file to the size of the compressed version. As the CR increases, the size of the compressed version decreases. Graph 355A of FIG. 3 shows a measure of human-perceived quality of compressed images (PQCI) (obtained, for example, using human annotators) along the Y-axis, and CR along the X-axis. Generally speaking, from the perspective of a content presentation service (similar to CPSs 150 of FIG. 1), higher PQCIs are better than lower PQCIs (as they tend to improve end-user experience), and higher CRs are better than lower CRs (as they tend to reduce network bandwidth requirements and latencies).

Graph 355A shows the PQCI-versus-CR curve averaged over all the images of an example data set. At low CRs, images may be perceived to be of high quality, and at very high CRs, the images may be perceived to be of low quality, but the extent of perceived quality degradation may not be linearly related to the extent of compression. Furthermore, if one classifies the images of a given data set into categories (such as category 1 for faces, category-2 for daylight landscapes, category-3 for furniture items, etc.), and plots the PQCI-versus-CR curves for each category separately, the shapes of the category-specific curves may differ from the shape of the overall curve of graph 355A. In Graph 355B, for example, representing category-1, the falloff in PQCI 310A may be steeper than in graph 355A for smaller CRs. In graph 355B for category-2, the falloff in PQCI 310B is generally smaller than that shown in graph 355A, while for category-3 images, graph 355D shows that the maximum reduction in PQCI may be less than that shown in graph 355A. Note that the graphs shown in FIG. 3 are synthetic examples presented to show that such variations in relationships between compression ratios and perceived image quality may exist, and may not necessarily correspond to actual measurements for any given data set or categories. The fact that the extent to which compression affects perceived quality may vary for different categories of images may be used at a media optimization service similar to MOS 110 of FIG. 1 in at least some embodiments to recommend custom image-category-specific compression algorithm hyper-parameter combinations as discussed below in further detail.

Overview of PQ Algorithms

Figure 4:
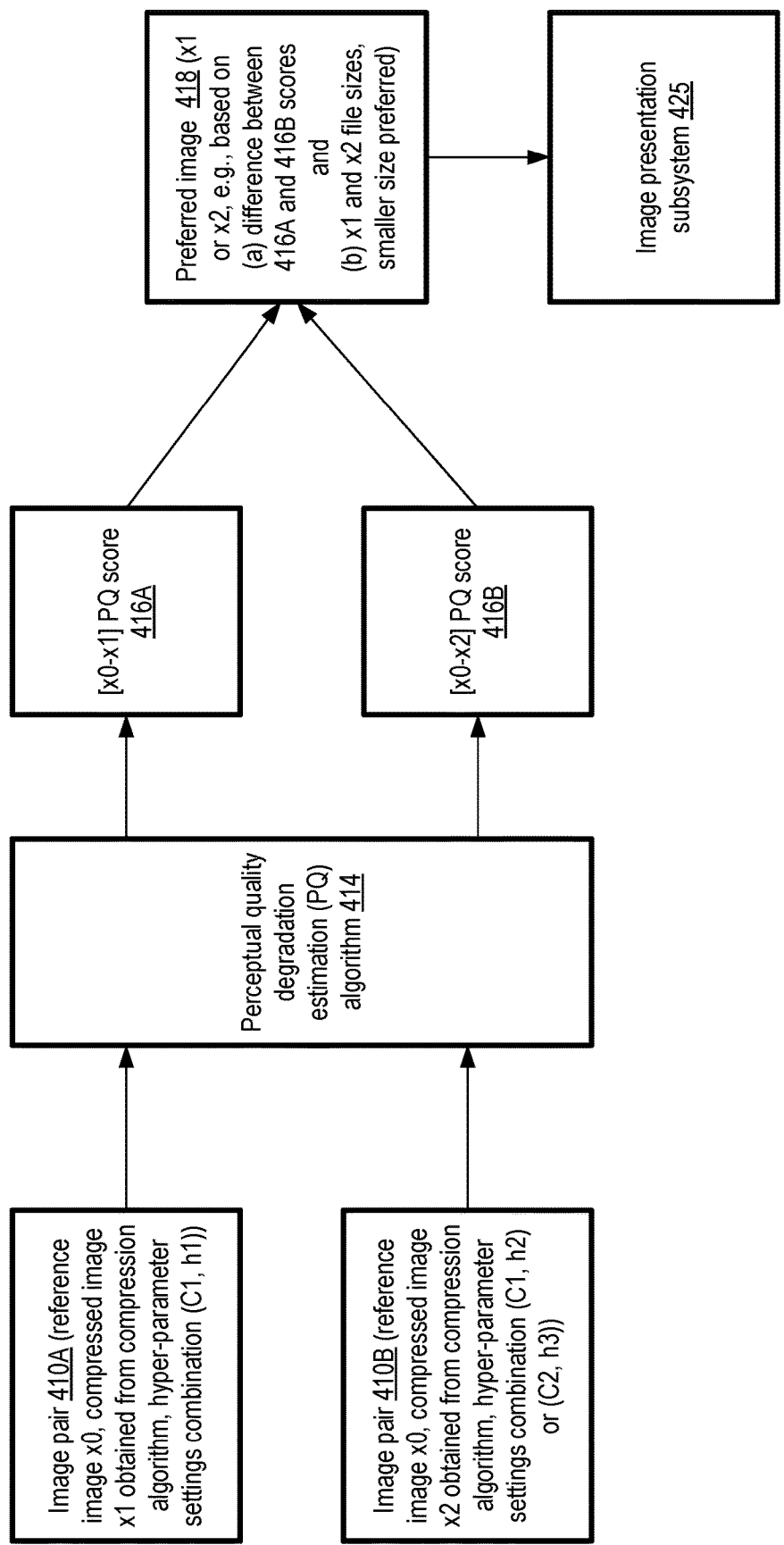
FIG. 4 illustrates example inputs and outputs of a perceived quality degradation estimation algorithm which may be used to select compressed images for presentation to end users, according to at least some embodiments.

As indicated earlier, a suite of existing PQ algorithms may be employed for training machine learning models that combine the technical advantages of existing PQ algorithms in various embodiments. Before considering the details of the techniques for training such models, it may be helpful to provide general information about the way in which PQ algorithms may be used. FIG. 4 illustrates example inputs and outputs of a perceived quality degradation estimation algorithm which may be used to select compressed images for presentation to end users, according to at least some embodiments.

In the depicted embodiment, a perceived quality degradation estimation algorithm 414 may consume two pairs of images, 410A and 410B, as input, and produce respective PQ scores 416A and 416B for each pair. Pair 410A may comprise an original image x0, and a compressed version x1 of x0, obtained for example from some compression algorithm C1 using a set of hyper-parameter values h1. Pair 410B may comprise the same original image x0, and a different compressed version x2 of x0. X2 may be obtained from a different compression algorithm and hyper-parameter combination than x1—e.g., using the same compression algorithm C1 and different hyper-parameters h2, or a different compression algorithm C2 and hyper-parameter values c3.

Algorithm 414 may generate PQ score 416A indicating the estimated or predicted extent of the degradation of x1 relative to x0, and PQ score 416B indicating the estimated or predicted extent of the degradation of x2 relative to x0. Based on the generated scores, a preferred compressed version 418 of x0 may be selected, and provided by an image presentation subsystem 425 to one or more viewers. The selection of the preferred image 418 may be based on a tradeoff between the PQ scores and the image sizes of the compressed versions. For example, in one embodiment, in order to choose a preferred image, a first weight W1 may be assigned to the difference in PQ scores 416A versus 416B, and a second weight W2 may be assigned to the difference in compressed file sizes, and a final preference score may be computed as the sum of the weighted values. Such approaches which combine file size and PQ scores may also be used in the iterative evolutionary optimization of compression algorithms as discussed below in further detail. Note that in some cases, a PQ algorithm 414 may of course be used to estimate the extent of degradation of perceived quality for a single compressed version of an image, so the input to the PQ algorithm may not necessarily comprise two compressed versions of the same image.

Example Algorithm-to-Algorithm Variations in PQ Scores

Figure 5:
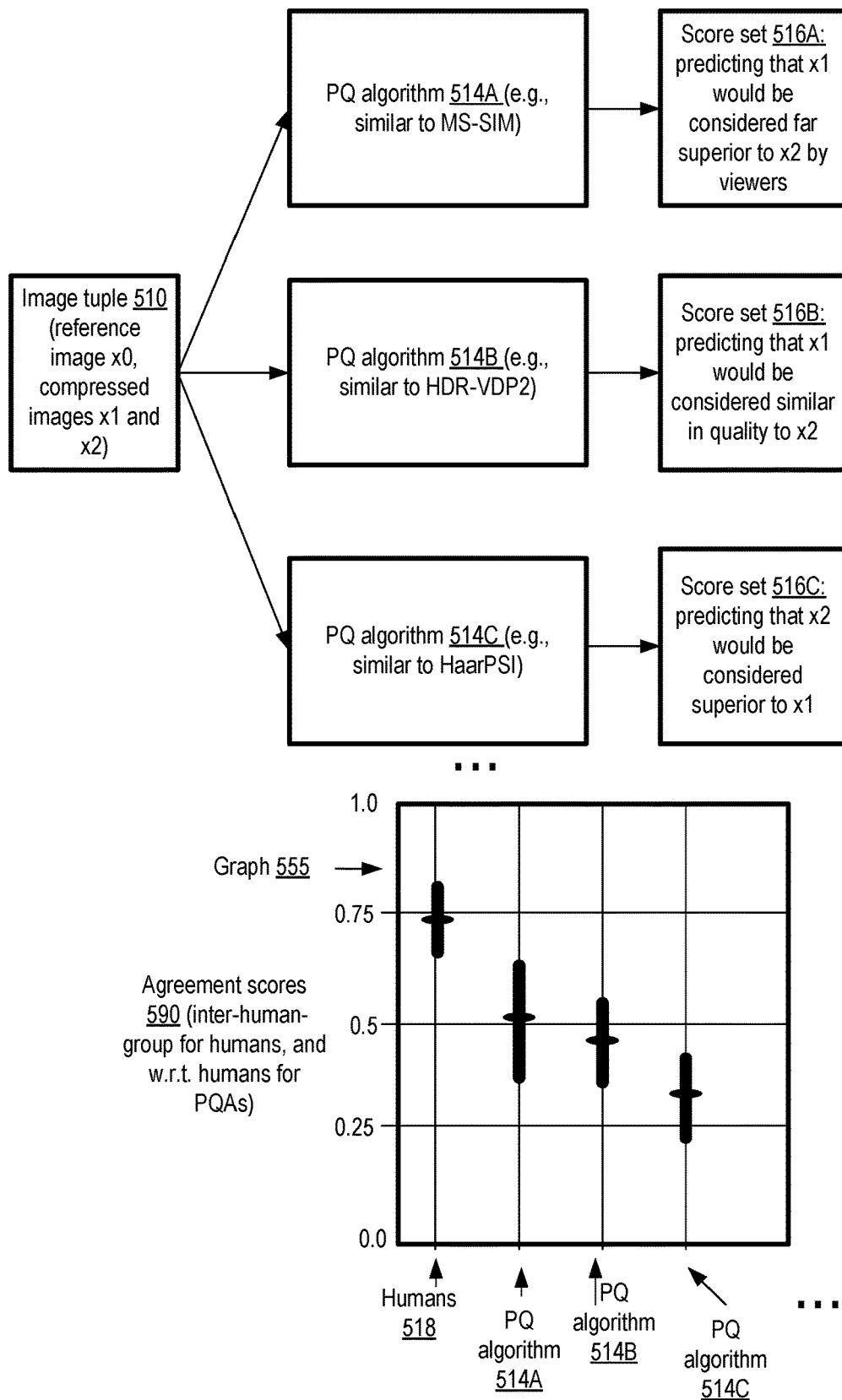
FIG. 5 illustrates example variations in quality scores produced by different perceptual quality algorithms, according to at least some embodiments.

As suggested earlier, a variety of PQ algorithms have been developed over the years, with different underlying assumptions about how best to model factors influencing perceived quality. In some cases, the PQ scores produced by respective algorithms for the same input images may vary substantially. FIG. 5 illustrates example variations in quality scores produced by different perceptual quality algorithms, according to at least some embodiments.

Respective PQ score sets 516A, 516B and 516C may be generated for the same image tuple 510 in the depicted embodiment by PQ algorithms 514A, 514B and 514C. Tuple 510 may comprise a reference image x0 and a pair of compressed versions x1 and x2 of the image. Score set 516A may predict that x1 would be considered far superior to x2 by viewers. Score set 516B may predict that viewers would consider x1 and x2 to be of about the same quality, while score set 516C may predict that x2 would be considered superior to x1.

Graph 555 shows example distributions of agreement scores 590 of the PQ algorithms with respect to the opinions of human annotators on the quality of a collection of image tuples. Note that these are simulated distributions, shown here to indicate the kinds of divergence exhibited by different PQ algorithms, and do not correspond to results obtained with any given data set. An agreement score for a given image tuple and a given PQ algorithm is a measure of the similarity of the PQ score generated by that PQ algorithm to the annotations/opinions expressed on average by the human annotators for that same image tuple. An agreement score for a given image tuple and the human annotators 518 is a measure of the similarity of the annotations/opinions expressed by the different annotators for that image tuple. The Y-axis of graph 555 represents agreement scores, plotted on a scale of 0.0 to 1.0, with 1.0 indicating perfect agreement and 0.0 indicating complete disagreement. Four ranges of agreement scores are shown, for human annotators 518 and for each of the three PQ algorithms 514A, 514B and 514C. The dark vertical black lines for each of the four cases indicate the minimum-to-maximum range of agreement scores over the collection of image tuples considered, with the small horizontal marks along the dark black lines indicating the average agreement scores computed for each case for the collection of image tuples. The range for humans (with the average close to 0.75) indicates the extent of agreement among the opinions of the different human annotators; if all the human annotators had the same opinions about all the figures, the range and average agreement score would both be represented by a single dot with a Y-axis value of 1.0.

As indicated in graph 555, the ranges and averages of the agreement scores of the three different PQ algorithms may diverge from one another for at least some image tuple sets. As suggested above, such divergence or disagreement may arise due to the underlying assumptions of the PQ algorithms. One of the PQ algorithms such as 514A may, for example, use an approach based on the MS-SSIM (Multi-scale Structural Similarity) technique. MS-SSIM decomposes an image into a multi-scale pyramid (iteratively downsampling the image). At each scale, the similarity between two images is measured in terms of luminance (mean), contrast (variance), and "structure" (covariance) over local regions, which are then weighted and spatially averaged to produce a final MS-SIM score.

Another of the PQ algorithms such as 514B may be based on the HDR-VDP2 (High Dynamic Range Visible Difference Predictor 2) methodology. This technique weights physical image differences according to assumptions about aspects of the human visual system, such as intra-ocular light scatter, opsin dynamics (photochemical processing in the retina), contrast sensitivity across the visible luminance range and contrast masking. A third PQ algorithm, such as 514C, may be based on the HaarPSI technique which performs image similarity analysis by measuring phase coherence in spatial filters. In this approach, phase congruency of Haar wavelets between the compared images in the vertical and horizontal directions is computed as a measure of similarity over space, and the similarity maps thus produced are weighted according to filter amplitude in the luminance channel. The dense weighted similarity map is then averaged to produce a final score for the compressed image. A variety of PQ algorithms, including but not necessarily limited to the algorithms discussed in the context of FIG. 5, may be employed to train a fusion machine learning model in at least some embodiments and/or to tune compression algorithms iteratively. Such PQ algorithms may include, among others, SSIM (Structural Similarity), FSIM (Feature Similarity), PSNR (Peak Signal to Noise Ratio), PSNR-HVS (Peak Signal to Noise Ratio-Human Visual System), VDP (Visible Difference Predictor), HDR-VDP (High Dynamic Range Visible Difference Predictor), Normalized Laplacian Pyramid, LPIPS (Learned Perceptual Image Patch Similarity), PieAPP (Perceptual Image-Error Assessment through Pairwise Preference) and VSI (Visual Saliency-Induced Index) algorithms.

Overview of Example Technique for Preparing Training Data Set

Figure 6:
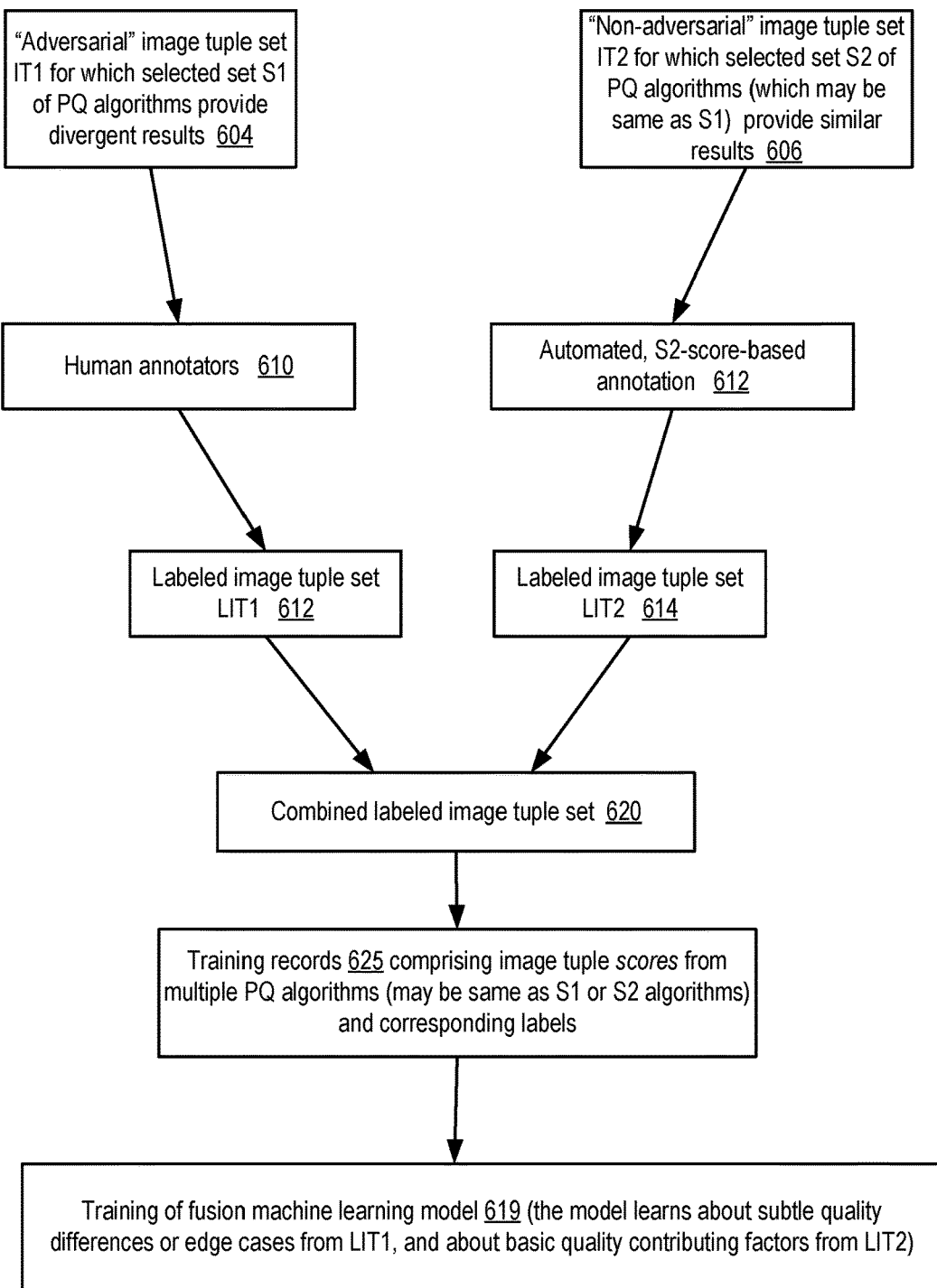
FIG. 6 illustrates an example technique for preparing a training data set for a machine learning model for predicting perceived image quality, according to at least some embodiments.

In at least some embodiments, a specially-curated set of images may be selected to help in the training of a machine learning model for generating PQ scores. FIG. 6 illustrates an example technique for preparing a training data set for a machine learning model for predicting perceived image quality, according to at least some embodiments. Two types of image tuples may be selected in the depicted embodiment for training such a model. An "adversarial" image tuple set IT1 as well as a "non-adversarial" image tuple set IT2 may be selected from a larger available group of image tuples, as indicated in elements 604 and 606 respectively. Each image tuple may comprise at least an original image, a first compressed version of the original, and a second compressed version of the original. An image tuple may be designated as "adversarial" if PQ scores generated for the image tuples (e.g., similar to the [x0-x1] and [x0-x2] scores discussed in the context of FIG. 4) by respective PQ algorithms of a set S1 differ by more than a threshold. Note that the divergence being considered for selecting image tuples for IT1 is the difference in PQ scores generated for the same image pair by the respective PQ algorithms, not the difference in the PQ scores generated for different image pairs of a given image tuple by any given PQ algorithm. Essentially, the adversarial image tuples represent cases in which a selected set S1 of PQ algorithms is unable to reach consensus (or near-consensus) regarding which compressed image is likely to be closer in perceived quality to the original.

In contrast, the non-adversarial image tuples of IT2 may be selected for reasons other than divergence in the PQ scores of different PQ algorithms in various embodiments. In fact, in some embodiments, image tuples for which a set of PQ algorithms S2 (which may be the same algorithms as those of set S1, or may differ in at least one algorithm from S1) agree or provide similar results may be chosen as members of IT2. The non-adversarial image tuples may be selected so as to capture cases where the choices regarding which of the compressed versions of a tuple is more similar to the original are more clear cut.

A set of human annotators 610 may be used to obtain labels for the adversarial image tuples, indicating which of the compressed versions were found more similar to the original image. The labels may be expressed by the human annotator 610s in any of a variety of ways in different embodiments: e.g., as a binary value (with a "1" for the less-degraded compressed version and a "0" for the more-degraded compressed version), or as a numerical value on a scale (e.g., a 10 on a scale from 1-10 for a compressed image which appears indistinguishable from the original, and a 1 for a compressed image which appears extremely dissimilar from the original). In at least some embodiments, the labels generated by different human annotators for a given image tuple may not be identical; in some such embodiments, a statistical aggregate (e.g., a mean or median label) may be computed from the different per-annotator labels. In at least one embodiment, analysis of the divergence in opinions among the human annotators may be performed, e.g., by annotation managers similar to those shown in FIG. 1). In some embodiments, the labels generated by those human annotators which are found to disagree extensively from other human annotators may be discarded or pruned; as such, only consensus or near-consensus annotators' labels may be retained for training the machine learning model in such embodiments. In at least one embodiment, the different labels generated for any given image tuple by the different human annotators may be examined for divergence, and outliers among the labels may be discarded or pruned on a per-image-tuple or per-image-pair basis.

Labels for the non-adversarial image tuples of IT2 may be generated automatically, without using human annotators in at least some embodiments, as indicated in element 612. Such labels may be based on the PQ scores generated by the algorithms of set S2 in various embodiments.

A combined labeled image tuple set 620 may be stored in various embodiments, comprising the human-annotator-labeled image set LIT1 derived from IT1, and the automatically-labeled image set LIT2 derived from IT2. Using the images included in the combined image tuple set, and a set of PQ algorithms (which may be the same algorithms as those included in S1 and/or S2, or may include at least one PQ algorithm which is not in S1 or S2), training records 625 for the machine learning model may be generated in the depicted embodiment. The training records may be organized as pairs in some embodiments, with each training record of a pair comprising respective PQ scores generated for a given (original image, compressed version) pair of an image tuple, and a corresponding label. The training records 625 may then be used to train a fusion model 619, which in effect learns indirectly (through the scores included in the training records) about subtle quality differences from the labeled image tuples of LIT1, and about more basic quality contributing factors from the labeled image tuples of LIT2. In at least some embodiments, a neural network based model may be used as the fusion model, as indicated in FIG. 7.

Overview of Example Architecture of Neural-Network Based Fusion PQ Model

Figure 7:
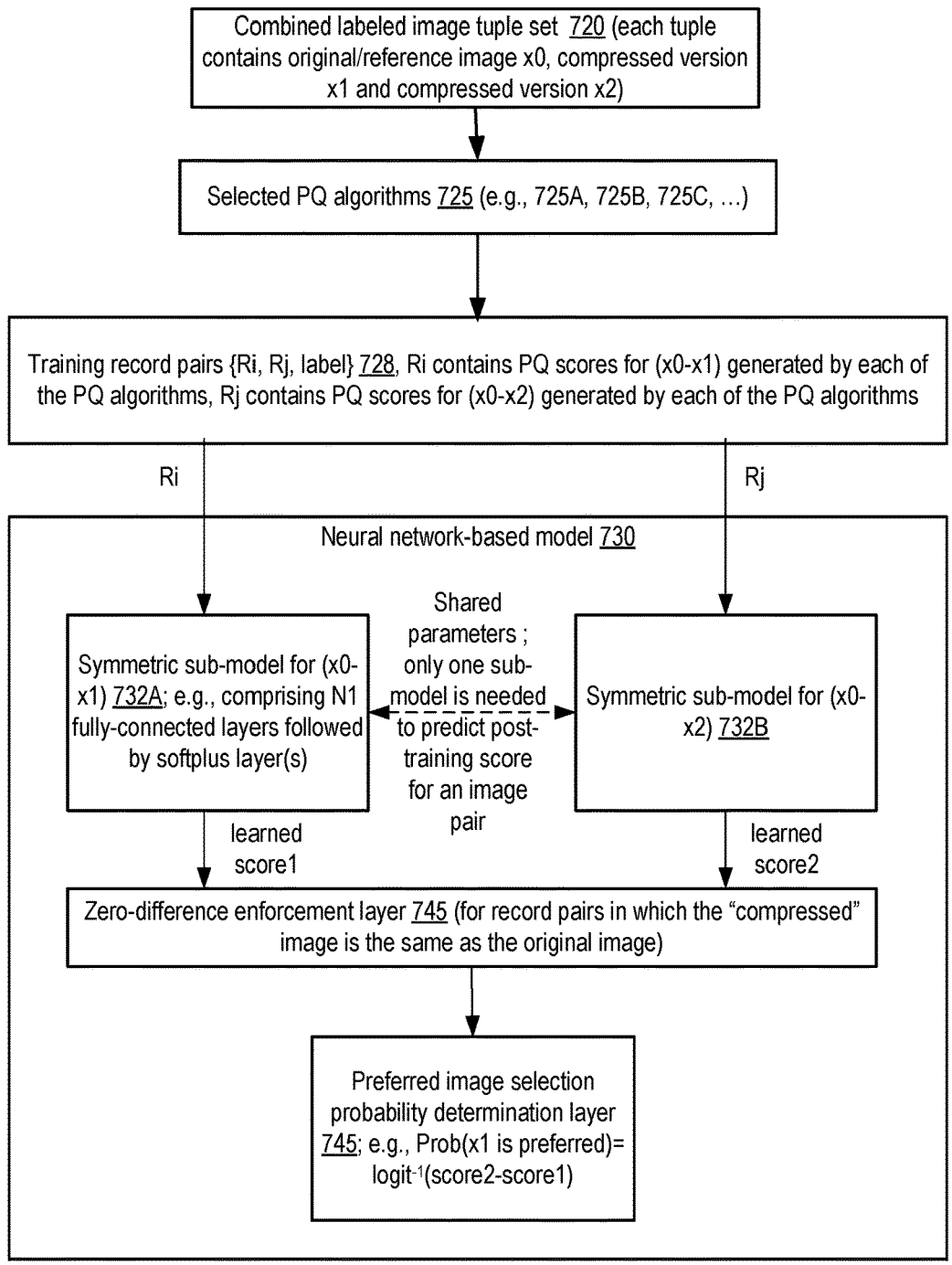
FIG. 7 illustrates an example architecture of a neural network-based model for predicting perceived image quality based on scores generated by multiple other perceptual quality algorithms, according to at least some embodiments.

FIG. 7 illustrates an example architecture of a neural network-based model for predicting perceived image quality based on scores generated by multiple other perceptual quality algorithms, according to at least some embodiments. As discussed in the context of FIG. 6, a combined labeled image tuple set 720 may be obtained in various embodiments, comprising adversarial as well as non-adversarial image tuples. Individual ones of the tuples may comprise an original image x0, and two compressed versions x1 and x2 of x0. A set of PQ algorithms 725 (e.g., 725A, 725B, 725C, etc.) may be selected to generate training records for the neural-network based model. The PQ algorithms may be selected based at least in part on information about the image presentation context(s) for which enhanced PQ scores are required in some embodiments; such information may be provided programmatically, for example, by clients of a media optimization service (MOS) similar to MOS 110 of FIG. 1 at which the fusion model is to be trained.

A set of training record pairs {Ri, Rj, label} 728 may be generated using the selected PQ algorithms and the labeled image tuple set 720 in the depicted embodiment. Record Ri may contain PQ scores for (x0-x1) generated by each of the PQ algorithms for a given tuple of set 720, while Rj may contain PQ scores for (x0-x2) for the same tuple and the same PQ algorithms. Ri and the label may be provided as input to one symmetric sub-model 732A of a neural network based model 730 in the depicted embodiment, while Rj and the label may be provided as input to a second symmetric sub-model 732B. Learned parameters (such as weights) may be shared among between the sub-models. A learned PQ score score1 may be generated for the (x0-x1) combination at the sub-model 732A, and a learned PQ score score2 may be generated for the (x0-x2) combination at the sub-model 732B. Each of the sub-models may comprise some number N1 of fully-connected layers followed by one or more Softplus layers in some implementations. A fully connected layer may, for example, perform a linear transformation $y=xA^T+b$ on the input data where A is the weight matrix and b is the bias vector. The output of the linear layer may be passed through a Softplus layer (Softplus(x)=log (1+exp(x)). Softplus allows gradient calculations for negative inputs. Output from this Softplus layer may be passed through one or more further combinations of linear and Softplus layers in some implementations. Such relatively simple neural network architectures may be sufficient in some embodiments because the training data has been curated to provide examples which capture salient information about images in a given presentation context very effectively; if examples which are less representative of the presentation context were used, or of a single model 730 were expected to provide PQ scores for a wide variety of image presentation contexts, more complex neural networks may be required.

In at least some embodiments, within a given image tuple used for generating the training records, one of the compressed image versions may be replaced by the original or reference version; for such image tuples, this "fake" compressed image would be expected to be considered superior to a visibly compressed version. A zero-difference enforcement layer 745 may be included in the model 730 to anchor the scale of the learned output, which forces the model's output learned score to a value indicating that the fake compressed image is of a higher quality than the compressed image of the same tuple. Thus, for example, if a learned score value of zero indicates that the compressed image of a given image pair is indistinguishable from the reference version, the output learned score would be set to zero for the image pair in which the "compressed" version is replaced by the original version. The model 730 may also include a deterministic preferred image selection probability determination layer 745 in some embodiments. For example, in one implementation, an inverse logit function may be used to determine the probability that x1 is preferred over x2 (that is, that x1's perceived quality is closer to that of the original than that of X2). The probability that x1 is preferred may be expressed as $logit^{-1}$(score2−score 1) in such an implementation. Note that after the model 730 is trained, either sub-model may be used to predict PQ scores for a given image pair, and both sub-models may not have to be used. Tunable hyper-parameters of the fusion model 730 may include, among others, the number of PQ models used to generate the training records, the specific combination of PQ models selected, how many "fake" compressed images are included in the image tuples, the number of training epochs, the training batch size, the learning rate, and the number and types of layers of the neural network in the depicted embodiment. Such hyper-parameters may be tuned in some embodiments using iterative evolutionary techniques as discussed below in further detail.

Methods for Fusion Model Training and Execution

Figure 8:
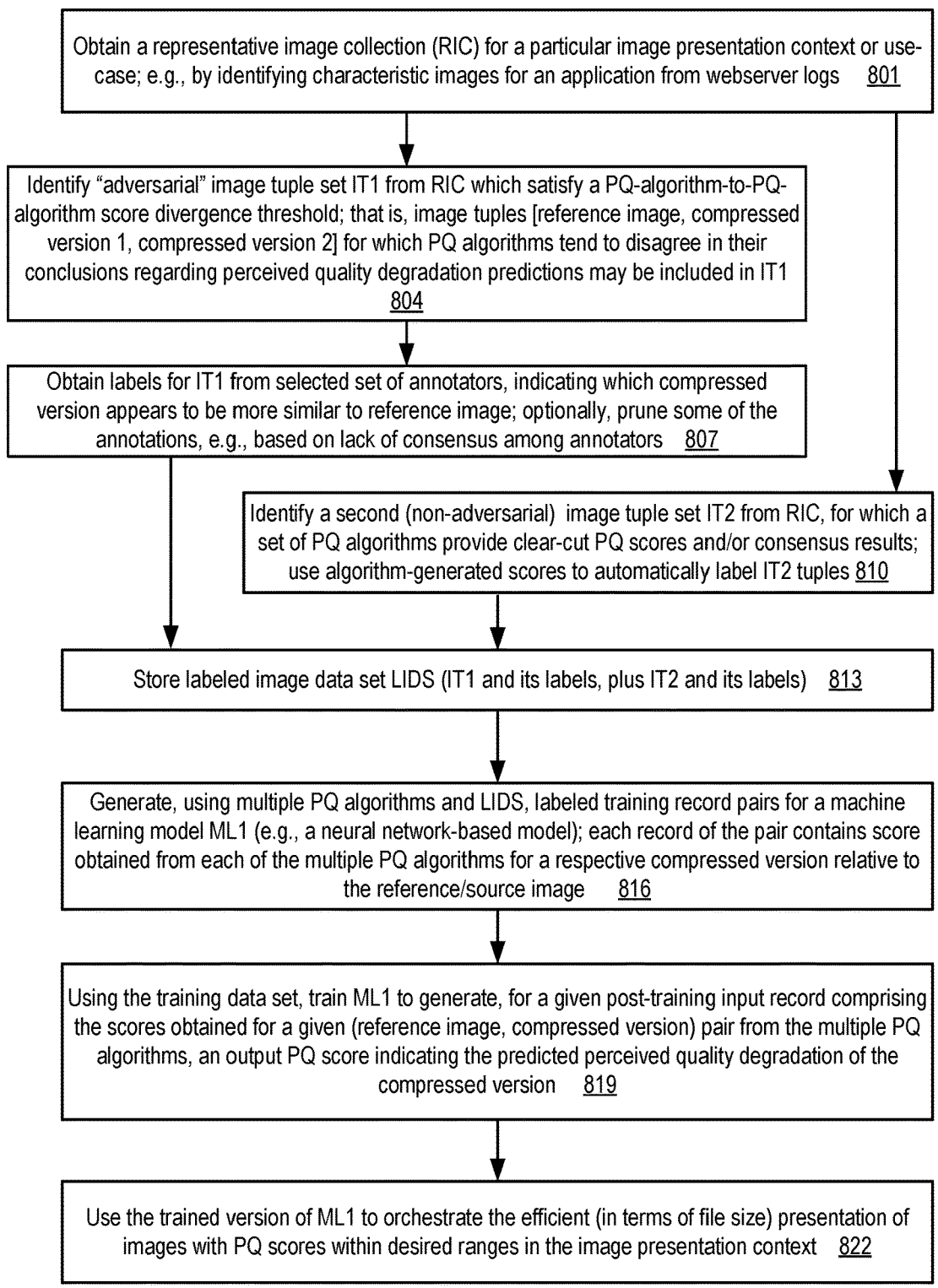
FIG. 8 is a flow diagram illustrating aspects of operations which may be performed to predict perceived image quality using a fusion model whose input comprises respective scores from multiple other perceptual quality algorithms on a combination of adversarial and non-adversarial training examples, according to at least some embodiments.

FIG. 8 is a flow diagram illustrating aspects of operations which may be performed to predict perceived image quality using a fusion model whose input comprises respective scores from multiple other perceptual quality algorithms on a combination of adversarial and non-adversarial training examples, according to at least some embodiments. As shown in element 801, a representative image collection RIC for a particular image presentation context or use case may be obtained, e.g., at a media optimization service similar in features and functionality to MOS 110 of FIG. 1. In one example scenario, for example, a collection of website logs (containing entries indicating which images and web pages have been served over some time period) of an application may be provided to and analyzed by an MOS component to determine the types of images that are typically presented to the application's users. Machine learning algorithms such as clustering algorithms and/or image recognition algorithms may be used to classify the served images, detect the kinds of objects included in the different classes, and so on. Uncompressed or baseline versions of at least some of the representative images may also be obtained in at least some embodiments.

An adversarial image set IT1 may be identified or selected from RIC (element 804) in various embodiments. Image tuples may be selected for inclusion in IT1 if they satisfy a PQ-algorithm-to-PQ-algorithm score divergence threshold. That is, image tuples (each comprising a reference image and at least two different compressed versions) may be included in IT1 if a set of PQ algorithms tend to disagree regarding which of the compressed versions is more similar to (and hence less degraded relative to) the reference image. A set of labels may be obtained for IT1 images from a set of human annotators in the depicted embodiments (element 807), indicating which of the compressed versions of a given tuple appears to be more similar to the reference version. In one embodiment, a subset of the human-generated annotations may optionally be pruned or removed from further consideration, e.g., due to a lack of consensus among the different annotators being used. In another embodiment, individual ones of the annotators may be identified as inconsistent or divergent with respect to other annotators, and such anomalous annotators may be removed from the pool of annotators (and the annotators generated by such anomalous annotators may be discarded).

A second, non-adversarial image tuple set IT2 may be identified in various embodiments from the RIC, and labeled automatically using PQ scores obtained from a set of PQ algorithms (element 810). In at least some embodiments, image tuples may be selected for inclusion in IT2 based at least in part on consensus or clear-cut preferences/scores generated by the PQ algorithms. A combined labeled image data set LIDS, comprising IT1 and its human-generated labels, as well as IT2 and its automatically-generated labels, may be stored in the depicted embodiment (element 813).

Using multiple PQ algorithms and the LIDS, labeled training records pairs may be generated for a machine learning model ML1, such as a neural network-based model (element 816). Each record of a record pair may comprise PQ scores from each of the multiple PQ algorithms for a respective compressed version of an image tuple relative to the reference image of the tuple. Some of the labeled records may be withheld for testing/validating the model in at least some embodiments. ML1 may then be trained using labeled record pairs (element 819) to generate, for a given post-training input record comprising the PQ scores (from the same PQ algorithms used in operations corresponding to element 816) for a compressed image relative to its reference image, an output PQ score indicating the perceived quality degradation of the compressed version relative to the reference image. The training may be terminated when the model meets prediction accuracy targets selected for the image presentation context or use case (as indicated using a testing data set), or when the resources or time used for the training reaches a threshold in some embodiments. The trained version of ML1 may be used to orchestrate the efficient (in terms of file size) presentation of images with PQ scores in target desired ranges in the image presentation context from which the RIC was obtained (element 822). For example, from among several different compressed versions of an image, the image which has the smallest file size among those images which satisfy a target PQ score requirement may be selected.

Figure 9:
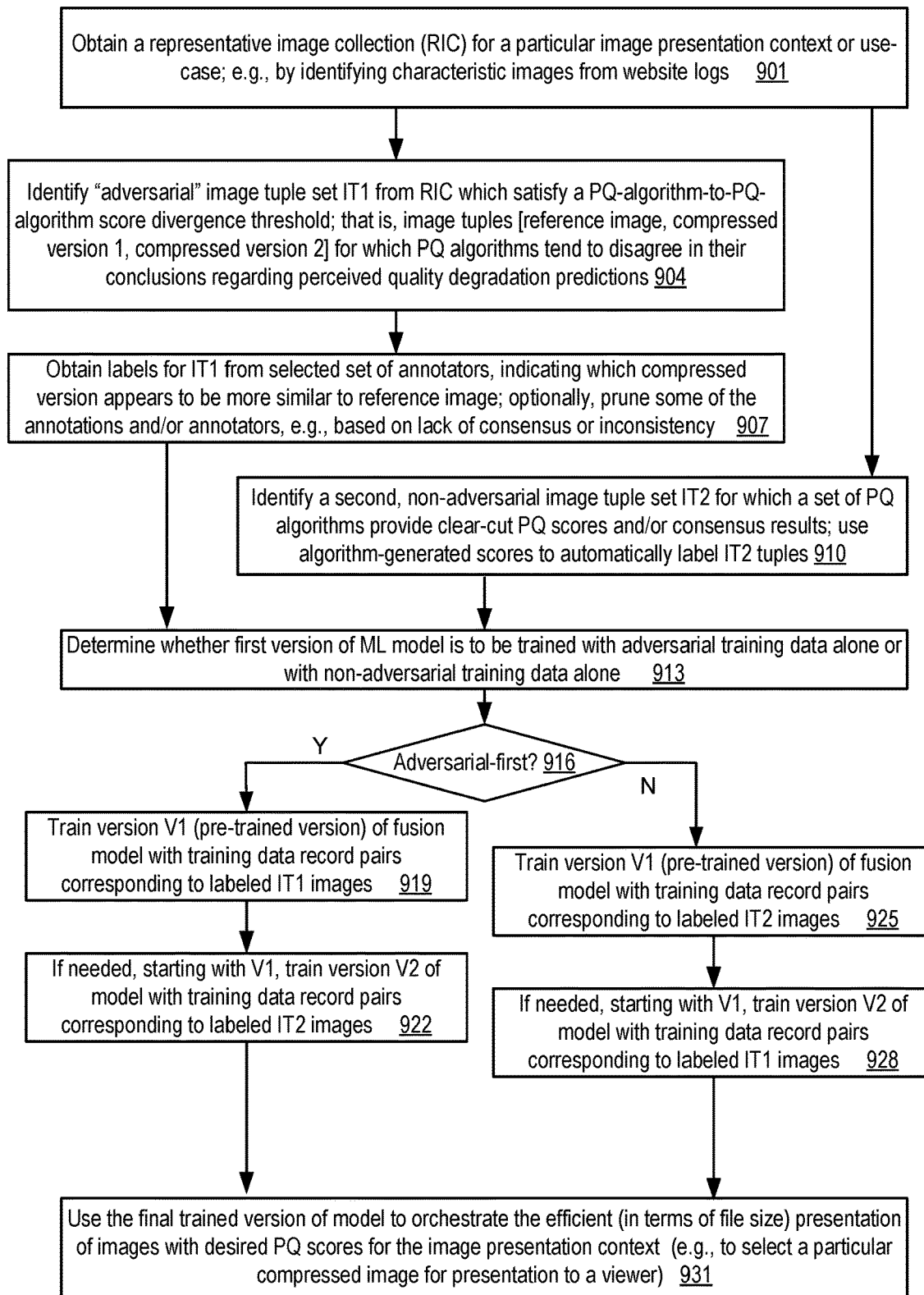
FIG. 9 is a flow diagram illustrating aspects of operations that may be performed in a two-stage process to train a machine learning model for perceived image quality prediction, in which adversarial training examples are used in one of the stages and non-adversarial training examples are used in the other stage, according to at least some embodiments.

In the procedure described above, adversarial and non-adversarial labeled images are combined and used together to train the fusion model. That is, in a given batch of training records, PQ scores obtained from multiple algorithms for some labeled adversarial image tuples and some labeled non-adversarial image tuples may be included. FIG. 9 is a flow diagram illustrating aspects of operations that may be performed in a two-stage process to train a machine learning model for perceived image quality prediction, in which adversarial training examples are used in one of the stages and non-adversarial training examples are used in the other stage, according to at least some embodiments. Operations corresponding to elements 901, 904, 907 and 910 of FIG. 9 in various embodiments may be similar to operations corresponding to elements 801, 804, 807 and 810 of FIG. 8 respectively: a representative image collection may be identified for a context, adversarial image tuple set IT1 and non-adversarial image tuple set IT2 may be identified, IT1 may be labeled with the help of human annotators and IT2 may be labeled automatically requiring the help of human annotators.

In operations corresponding to element 913 of FIG. 9, a decision may be made as to whether the adversarial training data alone is to be used first to train a first version of a fusion machine learning model, which is then trained further using the non-adversarial training data, or whether the opposite approach is to be used (training using the non-adversarial data first, followed by training using the adversarial data). This decision may be made based on various factors in different embodiments, such as the number of adversarial and non-adversarial image tuples which are available, properties of the image presentation context, client-specified preferences, and so on. In at least some embodiments, a knowledge base of a media optimization service may contain entries indicating which training approach (the approach of combining adversarial and non-adversarial data as indicated in FIG. 8, adversarial-first training, or non-adversarial-first training) has been found most effective for different scenarios or use cases, and such knowledge base entries may be used to decide how the training should be conducted.

If a decision is made to train a first version of the fusion model using adversarial training data alone (as indicated in element 916), version V1 of the model may be trained using training data record pairs corresponding to IT1 images (element 919). It may turn out to be the case that this first version V1 (also referred to as a pre-trained version) of the model satisfies the target prediction accuracy goals for the use case being considered, in which case no further training may be required. If, however, the goals have not been met, a second version V2 of the model may be trained using record pairs corresponding to labeled IT2 images (element 922) in the depicted embodiment.

Similarly, if a decision is made to train a first version of the fusion model using non-adversarial training data alone (as also determined in operations corresponding to element 916), version V1 (the pre-trained version) of the model may be trained using training data record pairs corresponding to IT2 images (element 925) in at least some embodiments. If this first version V1 of the model satisfies the target prediction accuracy goals for the use case being considered, no further training may be required. If, however, the goals have not been met, a second version V2 of the model may be trained using record pairs corresponding to labeled IT1 images (element 928) in the depicted embodiment. The final trained version of the model may be stored in various embodiments, and used to orchestrate the efficient presentation of image with PQ scores in desired ranges in the image presentation context for which the model was trained (element 931).

Figure 10:
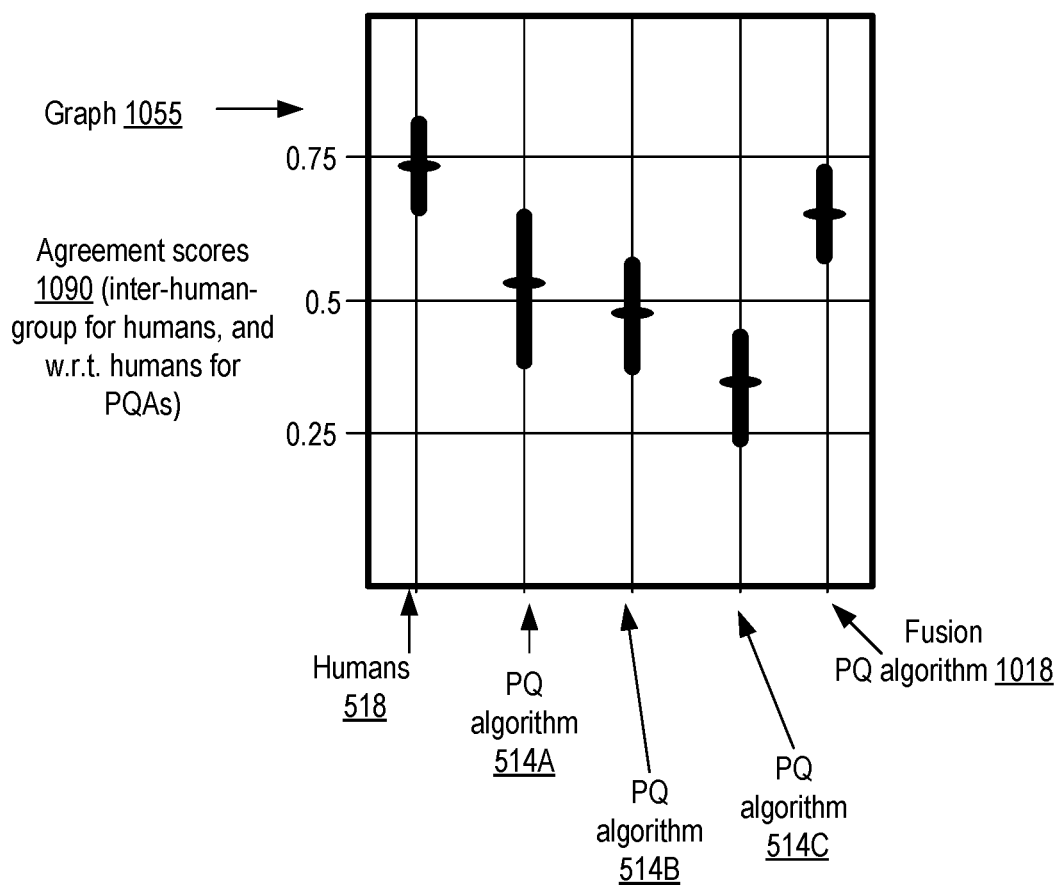
FIG. 10 illustrates example improvements in results which may be achieved using a fusion model for predicting perceived image quality, according to at least some embodiments.

FIG. 10 illustrates example improvements in results which may be achieved using a fusion model for predicting perceived image quality, according to at least some embodiments. Graph 1055 of FIG. 10 shows the same information as was presented in graph 555 of FIG. 5, but with additional agreement scores plotted for a fusion model trained using methodology similar to that depicted in FIG. 8. For the pairs of training records used to train the fusion model (whose results are indicated by label 1018), scores generated by PQ algorithms 514A, 514B and 514C for a labeled image tuple set were used.

As shown, the fusion model's agreement score results with respect to human annotators are superior, at least on average, to those of each of the PQ algorithms which were used to train the fusion model in the depicted embodiment. The extent of the improvement in agreement scores obtained using the fusion approach may of course vary with the PQ algorithms and the image presentation context being considered in various embodiments. In some cases, for a given image presentation context and corresponding representative image set, the best agreement scores achieved by a given PQ algorithm used for generating the training data may be superior to some of the agreement scores achieved using the fusion methodology—e.g., the low end of the fusion model agreement score range 1018 overlaps with the high ends of the ranges for PQ algorithms 514A and 514B.

Example Programmatic Interactions Associated with Fusion Models

Figure 11:
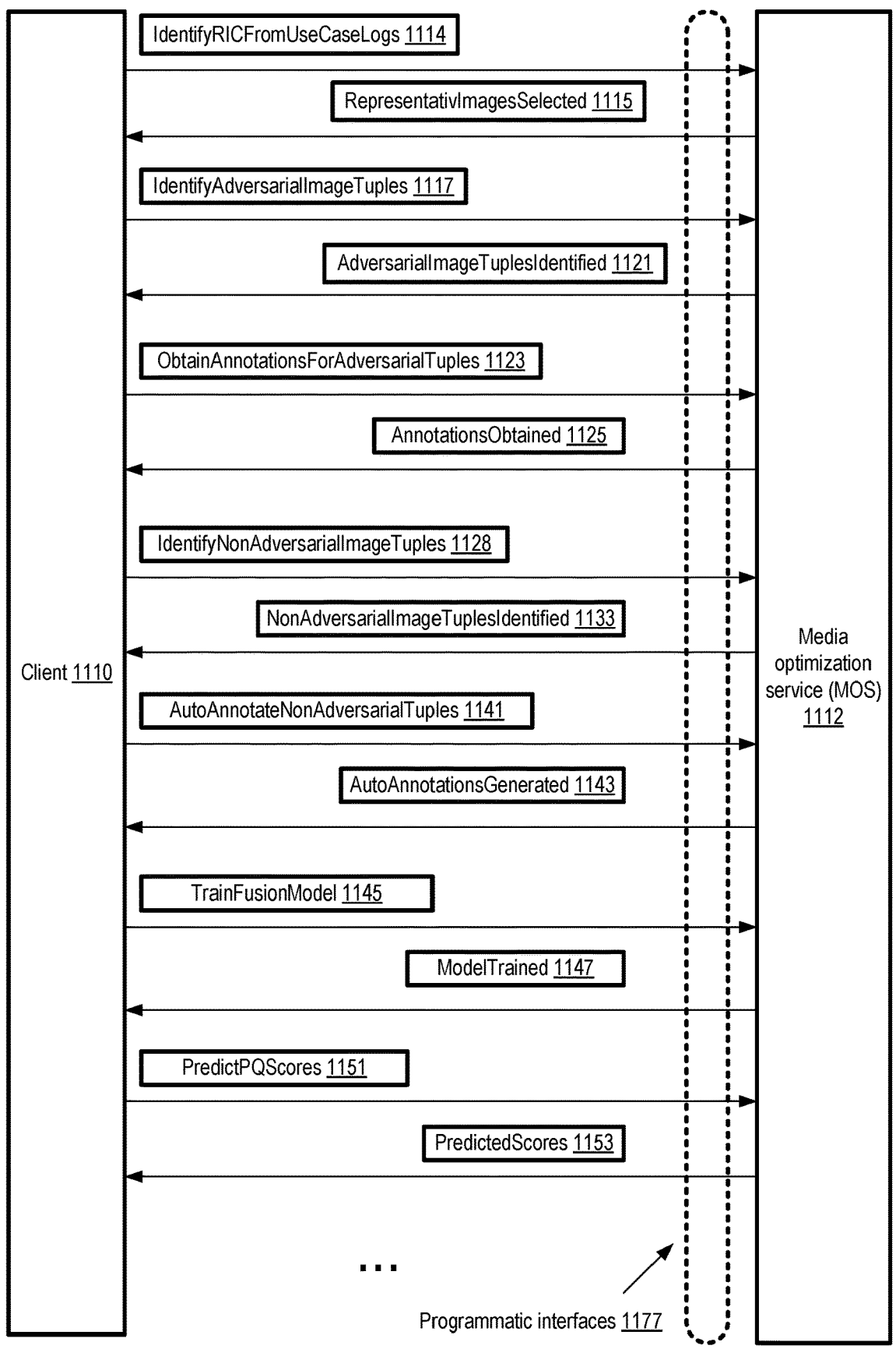
FIG. 11 illustrates example programmatic interactions associated with the training of a fusion model for predicting perceived image quality, according to at least some embodiments.

As mentioned earlier, in various embodiments a media optimization service may implement programmatic interfaces to enable clients to submit requests pertaining to compression techniques and receive corresponding responses. FIG. 11 illustrates example programmatic interactions associated with the training of a fusion model for predicting perceived image quality, according to at least some embodiments. Programmatic interfaces 1177 implemented by MOS 1112 (similar in functionality to MOS 110 of FIG. 1) may include a set of APIs, web-based consoles, command-line tools, graphical user interfaces and the like in different embodiments.

A client 1110 may submit an IdentifyRICFromUseCaseLogs message 1114 to the MOS 1112, providing a pointer to some collection of logs which indicate the kinds of images that were served to end users of an application or service over some period of time, from which the MOS is being requested to select representative image collections (RICs) for one or more image presentation contexts represented in the logs in the depicted embodiment. The MOS 1112 may extract the list of images from the log files, along with information about the temporal distributions of the presentations of the images, and analyze the extracted information to select a subset of images as representative of the contexts or use cases. A RepresentativeImagesSelected response message 1115 may be sent to the client in some embodiments after the representative images have been identified.

In some embodiments, a client 1110 may submit an IdentifyAdversarialImageTuples request 1117 to the MOS, requesting the selection of image tuples from a specified RIC for which a selected set of PQ algorithms tend to disagree on their predicted PQ scores. In some embodiments, the client 1110 may indicate the particular PQ algorithms whose scores for the same image tuples are to be compared to identify the adversarial tuples. In other embodiments, the MOS may select the PQ algorithms, e.g., using a knowledge base. The selected or client-specified PQ algorithms may be used to generate respective PQ scores for at least a portion of the RIC in the depicted embodiment. The scores produced by the different algorithms may be examined to identify those tuples whose inter-algorithm score divergence exceeds a threshold, and such tuples may be included an adversarial image tuple set. The threshold itself may be indicated by the client 1110 in some embodiments, or selected by the MOS 1112. In some embodiments, a divergence criterion rather than a precise threshold may be used—e.g., the image tuples whose divergence measures are in the top N % among the divergence scores being examined may be included in the adversarial image tuple set. An AdversarialImageTuplesIdentified response message 1121 may be sent to the client to the client after the adversarial image tuple set has been selected in at least some embodiments.

A client 1110 may submit an ObtainAnnotationsForAdversarialTuples request 1123 to the MOS in some embodiments, indicating that human-provided annotations are to be obtained for a specified set of adversarial image tuples. In response, annotation manager components of the MOS 1112 (similar to annotation managers 134 of FIG. 1) may orchestrate an annotation procedure. Such a procedure may, for example, comprise identifying/selecting available annotators, providing labeling instructions to the annotators, setting up the environments in which the annotators are to view the image tuples or image pairs, presenting the images of the specified set to the annotators in those environments, obtaining the annotations from the annotators, and post-processing the results in at least some embodiments. In some cases, for example, the inter-annotator consistency among the annotators may be analyzed to determine a measure of the extent of agreement among different human annotators, and outliers of one or more kinds may be identified in the post-processing phase. One type of outlier may comprise image tuples for which different human annotators tend to disagree; in some embodiments, at least some such outlier image tuples may be removed or excluded from the labeled adversarial image tuple set. Individual annotators whose opinions tend to diverge consistently from those of other annotators may represent another class of outlier identified by the MOS 1112 in some embodiments; some or all of the labels produced by such outlier annotators may be discarded when preparing the labeled adversarial image set in such embodiments. After the annotations have been obtained and post-processed, an AnnotationsObtained message 1125 may be sent to the client 1110 in some embodiments.

In at least one embodiment, a client may submit an IdentifyNonAdversarialImageTuples request 1128 to the MOS via programmatic interfaces 1177. Such a request may indicate representative image collection from which a non-adversarial image tuple set (i.e., a collection of image tuples for which different PQ algorithms tend to agree) is to be identified. In some embodiments in which scores generated by different PQ algorithms for representative images have already been obtained from the same representative image collection in the process of selecting adversarial images, some or all of those same scores (the ones representing strong inter-PQ-algorithm agreement rather than disagreement) may be used to select the members of the non-adversarial image tuple set. The client may in some cases use parameters of request 1128 to indicate which PQ algorithms are to be used to select non-adversarial tuples. If scores from the PQ algorithms to be used for the selection of non-adversarial image tuples have not already been obtained, the specified PQ algorithms may be run with respect to the specified representative images and the tuples for which the agreement among the PQ algorithms exceeds a threshold may be selected in the depicted embodiment. After the non-adversarial image tuples have been selected, a NonAdversarialImageTuplesIdentified message 1133 may be sent to the client 1110 in some embodiments. In at least one embodiment, a client 1110 may provide a set of non-adversarial image tuples to the MOS, and/or a set of adversarial image tuples, instead of requesting the MOS to select the sets.

A client 1110 may submit an AutoAnnotateNonAdversarialTuples request 1141 in some embodiments, requesting that annotations be generated automatically (e.g., using scores obtained from one or more PQ algorithms) at the MOS for a specified set of non-adversarial image tuples. Such annotations or labels may be obtained at the MOS, e.g., by an annotation manager without the help of human annotators, and an AutoAnnotationsGenerated message 1143 may be sent to the client.

In at least some embodiments, a client 1110 may submit a TrainFusionModel request 1145 to the MOS 1112, requesting that a machine learning model (e.g., similar to the neural network-based model of FIG. 7) be trained on behalf of the client. In some embodiments, the request 1145 may indicate the specific PQ algorithms to be used to generate the scores included in the training records for the model, and/or values for other hyper-parameters values such as the initial learning rate, the batch size, the number of epochs, etc. In one embodiment, a client may simply provide an indication of a representative image collection to be used to train a fusion model in a TrainFusionModel request, and the MOS 1112 may perform the various needed tasks automatically, including identifying and obtaining annotations for an adversarial and non-adversarial set of image tuples and then training the model. In such an embodiment, separate requests 1117, 1123, 1128 and/or 1141 may not be required. Some clients may prefer to let the MOS decide details, such as which PQ algorithms are to be used at each stage, while others may prefer to indicate their preferences regarding one or more of the steps involved in training the model. After the fusion model has been trained, the trained version may be stored, and a ModelTrained message 1147 may be sent to the client in some embodiments.

A client 1110 may request that PQ scores be predicted using the trained version of the fusion model on a specified collection of one or image pairs or tuples by submitting a PredictPQScores request 1151 in some embodiments. The model may be executed by the MOS 1112, and the predicted scores generated may be provided to the client in one or more PredictedScores messages 1153. In at least some embodiments, results obtained from the trained model may be used to select hyper-parameters of a compression algorithm used to present images from a web site or other content presentation environment. The output of the trained version of the model in such a scenario may comprise (a) a first set of quality degradation scores for a first set of compressed images produced using a first set of hyper-parameters of a compression algorithm, and (b) a second set of quality degradation scores for a second set of compressed images produced using a second set of hyper-parameters of the compression algorithm. The output quality degradation scores for the two hyper-parameter value combinations may be compared, and the combination which led to superior perceived image quality may be used to present a set of images to viewers. In some embodiments, fusion model-related programmatic interactions other than those shown in FIG. 11 may be supported by an MOS 1112.

Example Image File Formats and Compression Algorithm Sub-Operations

A media optimization service may support the analysis and tuning of a wide variety of compression algorithms, associated with numerous file formats in some embodiments. The compression algorithms may comprise a pipeline of several stages or sub-operations in some cases, several of which may have associated hyper-parameters which can be tuned for different image presentation contexts at the optimization service in response to client requests. FIG. 12 illustrates example compressed image file formats and compression algorithm sub-operations, according to at least some embodiments. File formats 1210 for which compression algorithm optimization is supported at an MOS may include, among others, JPEG 1211, WebP 1212 (a format derived from the VP8 video file format), AVIF (a still image file format based on AOMedia Video 1) 1213, and MP4 (Moving Pictures Expert Group-4) 1224 in the depicted embodiment.

A compression algorithm pipeline may comprise operations or stages of several different types 1220 in different embodiments. Such stages may include, depending on the specific compression algorithm and file format, chroma subsampling 1221, block prediction 1222, transformation to frequency domain 1223, quantization 1224, run-length encoding 1225, and the like.

In some image compression techniques, the image may be converted to the YUV color space, which has one brightness channel (luma) and two color channels (chrominance). Chroma sub-sampling (such as YUV420, in which the U and V channels have half the resolution of the Y channel) may be applied to the chrominance channels, effectively reducing the resolution of the chrominance images and taking advantage of the fact that the human visual system is less sensitive to fine changes in color relative to brightness. JPEG offers chroma subsampling as an option, while WebP enforces it. Settings for whether chroma sub-sampling is to be performed, and if so, the specific resolution ratios for the chrominance channels relative to the luma, may constitute one set of hyper-parameters for a compression algorithm.

With advances in video codec technology, many ideas for video compression have been adapted to still images. Intra-frame block prediction became popular through WebP, which is derived from the VP8 video codec. In block prediction, a respective prediction model is applied to sub-blocks of a macro block, effectively performing filtering. The best predictor for a given block is identified using the model, and the output (residuals) are then quantized.

In some image compression techniques, the image obtained after color space transformation is divided into pixel blocks (e.g., 8×8 pixel blocks with JPEG and 16×16 or 8×8 pixel blocks in WebP) which are then transformed into the frequency domain. For example, a discrete cosine transforms (DCT) algorithm is used for JPEG and WebP and a discrete wavelet transforms algorithm is used for JPEG2000. In some cases, as with AVIF, any of multiple transform algorithms may be used. Conversion into the YUV space and a loss of precision in the transformation to the frequency domain can lead to distortions. The image blocks after the conversion may be quantized, e.g., according to respective quantization tables for the different channels. For JPEGs, the DCT terms may be divided by the corresponding value in a quantization table, and rounded to the nearest integer. Higher values in the quantization tables may lead to higher probabilities that the results of the division step are zero. For WebP, the input for quantization comprises block predictions, not the raw image data itself. In some implementations, after quantization tables have been tuned (e.g., using the iterative evolutionary approach discussed below in further detail), the tuned tables may be transmitted for use at the media consumption interface devices.

JPEG compression uses run-length zig-zag encoding (RLE) of the 8×8 frequency coefficient blocks, taking advantage of sparsity patterns in the coefficient blocks. RLE transforms a sequence of values into sequences of pairs. The first element of a pair is called a symbol, and the second element is a non-zero value. For each sequence of values, the symbol is used to code the number of preceding zeros and the bit length of the non-zero value. In RLE, one value is used to indicate the number of consecutive zeros before the next non-zero value in the data. JPEG images can be further optimized through progressive encoding, and may benefit from Huffman or arithmetic coding as well. WebP utilizes arithmetic coding.

When considering the choices for a compression pipeline, content presentation services may have to select values for a number of hyper-parameters (e.g., on the order of dozens or hundreds of values for quantization tables alone) for the various stages of the pipeline at which some combination or all of the operation types shown in FIG. 12 may be performed. In various embodiments, the factors to be taken into consideration may include encoding (compression) and decoding speeds, the compression ratios achieved, as well as compatibility of the expected media consumption interface devices with the compression algorithms—for example, not all browsers at some smart phones or tablet devices may be able to perform complex computations needed to reconstruct images compressed using some compression pipeline settings.

Overview of Iterative Compression Algorithm Optimization

Figure 13:
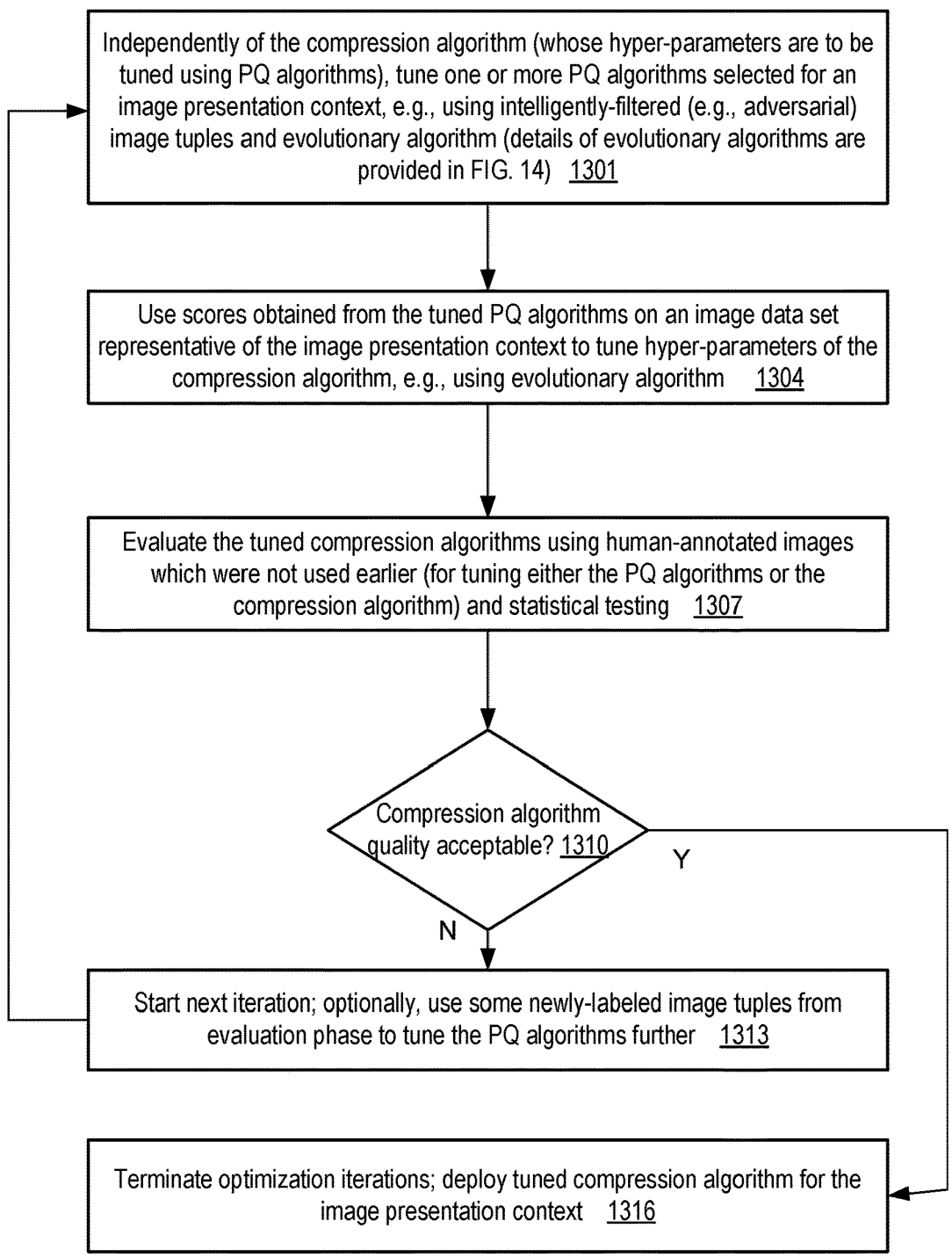
FIG. 13 is a flow diagram illustrating a high-level overview of an iterative compression algorithm optimization technique, according to at least some embodiments.

FIG. 13 is a flow diagram illustrating a high-level overview of an iterative compression algorithm optimization technique, according to at least some embodiments. The approach presented in FIG. 13 resolves the "chicken-and-egg" problem of tuning compression algorithms mentioned earlier: namely, that in order to tune a compression algorithm in an automated manner, one usually needs a sufficiently-tuned PQ algorithm, but the process of tuning the PQ algorithm may itself require using a sufficiently-tuned compression algorithm.

A compression algorithm whose hyper-parameters are to be tuned using one or more PQ algorithms for a given image presentation context may be identified. In operations corresponding to element 1301, which represent a first phase of a three-phase optimization iteration, the PQ algorithms may themselves be tuned without relying on the compression algorithm. This may be done, for example, using intelligently filtered image tuples of an image collection and an evolutionary algorithm. Details of the types of evolutionary algorithms which may be used in various embodiments are provided in FIG. 14 and discussed below. In some implementations, adversarial image tuples of the kind discussed earlier may be identified and included in the data set used to tune the PQ algorithms.

Once the PQ algorithms have been independently tuned, they may be utilized to generate PQ scores (predictions of perceived degradation in quality of compressed versions of images, relative to reference images) for an image data set representative of the image presentation context (element 1304). The compressed versions of the images for which the PQ scores are generated may be obtained using various combinations of hyper-parameter values of the compression algorithm. An evolutionary algorithm may also be used for tuning the compression algorithm in various embodiments, with independent evolutionary algorithm parameters being used for tuning the compression algorithm than were used for tuning the PQ algorithms.

A tuned compression algorithm, obtained as the output of operations corresponding to element 1304, may then be evaluated using a set of human-annotated images which were not used earlier (for tuning either the PQ algorithms or the compression algorithm) in the depicted embodiment (element 1307). In addition, in at least some embodiments, statistical tests may be run as part of the evaluation phase to compensate for potential biases which might otherwise have reduced the apparent variance in the evaluation results.

If the quality of the tuned compression algorithm is found to be satisfactory in the evaluation phase (as determined in operations corresponding to element 1310), the optimization procedure may be terminated, and the tuned compression algorithm may be deployed for the image presentation context for which it was tuned (element 1316). If the quality of the compression algorithm is found unsatisfactory (as also detected in operations corresponding to element 1310), another optimization iteration may be started (element 1313). Optionally, some of the newly-labeled images used in the evaluation phase of the current iteration may be re-used in the PQ algorithm tuning phase of the next iteration.

Overview of Evolutionary Algorithms

Figure 14:
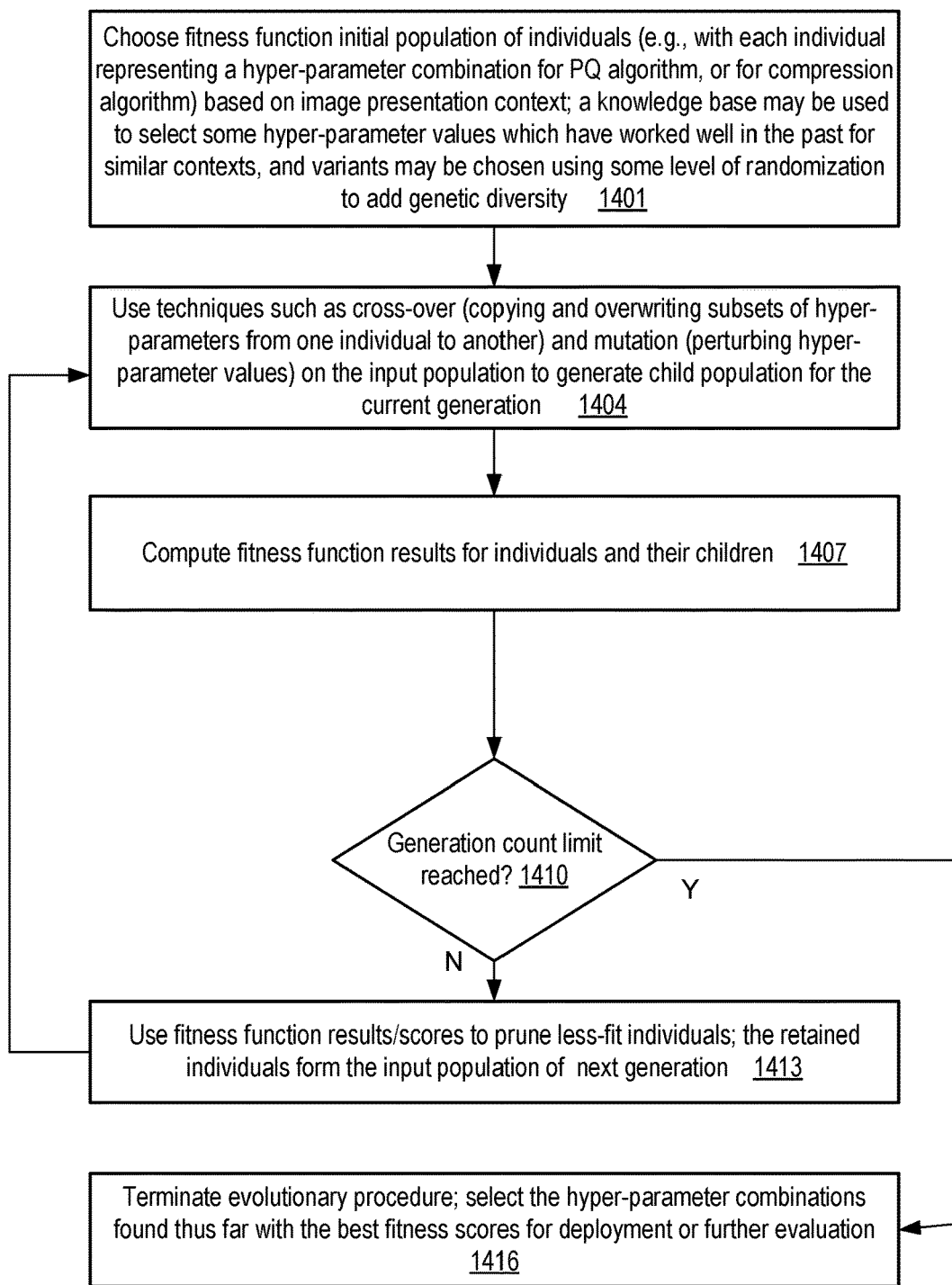
FIG. 14 is a flow diagram illustrating a high-level overview of an evolutionary algorithm which may be employed at one or more stages of an iterative compression algorithm optimization technique, according to at least some embodiments.

Evolutionary or genetics-based algorithms, which attempt to mimic aspects of individual-to-individual variation and fitness-dependent survival phenomena observed in biological species, may be used to tune PQ algorithms as well as compression algorithms in at least some embodiments as indicated above. Such algorithms may be especially beneficial for use in the compression context because, given the extremely large number of possible hyper-parameter value combinations, performing exhaustive or grid-based optimization may be computationally infeasible. FIG. 14 is a flow diagram illustrating a high-level overview of an evolutionary algorithm which may be employed at one or more stages of an iterative compression algorithm optimization technique, according to at least some embodiments.

As shown in element 1401, a fitness function and an initial population of individuals may be selected for a given optimization problem being addressed using the evolutionary approach. Each of the individuals may represent a hyper-parameter combination (PQ algorithm hyper-parameters for the first stage of the optimization iterations discussed in the context of FIG. 13, and compression algorithm hyper-parameters for the second stage), selected for the particular image presentation context for which optimization is being performed. The fitness function may be used to select, from a given group of individuals of one generation or iteration of the evolutionary algorithm, the ones that survive for the next generation (either in unmodified form, or with some variations). For example, for PQ algorithm optimization, in some embodiments the fitness function may indicate how closely the quality degradation predictions obtained with a given PQ hyper-parameter combination match the judgments of human annotators. For compression algorithms, in at least some embodiments the fitness function may be based on a combination of the file sizes of the compressed images, and the PQ scores generated for the compressed images. In some embodiments, a knowledge base of a media optimization service may be used to select the initial population and/or the fitness function for a given image presentation context or use case; the knowledge base may, for example, contain entries indicating hyper-parameter value combinations which have worked well for similar contexts in the past, and such combinations may be used for the initial population.

Using genetics-inspired techniques such as cross-over (copying and overwriting subsets of hyper-parameters from one individual to another and mutation (e.g., introducing random perturbations in hyper-parameter values), a set of child individuals may be created from the input population (the "parents") of a given generation (element 1404). (For the very first generation, the initial population is the input population.) Cross-over and mutation may respectively represent exploitation and exploration aspects of optimization: cross-over tends to retain characteristics of "fitter" individuals across generations and thus represents exploitation of known successful characteristics, while mutation introduces new variants which could potentially lead to the discovery and exploration of new successful characteristics. The exploitation versus exploration tradeoff may also be reflected by parameters which determine how many children are to be created in a given generation from a given number of parents. A set of parameters representing exploitation versus exploration tradeoffs (e.g., the number of children per parent, the rate/number of mutations and/or the rate/number/size of cross-over sets of hyper-parameters) may be chosen for the evolutionary algorithm in various embodiments, e.g., by an MOS or by a client on whose behalf the MOS is performing evolutionary optimization iterations. Results of the fitness function may be obtained for the individuals of the input population and their children (element 1407).

Evolutionary algorithms may be executed until a preselected limit on the number of generations has been reached in various embodiments. In operations corresponding to element 1410, a determination may be made as to whether this limit has been reached in the depicted embodiment. If the limit has been reached, the evolutionary procedure may be terminated (element 1416). One or more hyper-parameter combinations that had the best fitness scores found thus far may be chosen for deployment or for further analysis in various embodiments. If the generation count limit has not been reached, as also determined in operations corresponding to element 1410, the fitness function results or scores may be used to prune some fraction of the less-fit individuals, and the remaining individuals (which may in principle include some children and some parents, only children, or only parents) may form the input population of the next generation. Operations corresponding to elements 1404 onwards may then be performed with respect to the next generation. It is noted that other variants of evolutionary techniques may be used in some embodiments than that shown in FIG. 14: for example, less-fit parents may be pruned before any children are generated using cross-over or mutation in one embodiment.

Methods for Iterative Evolutionary Optimization of Compression Algorithms

Figure 15:
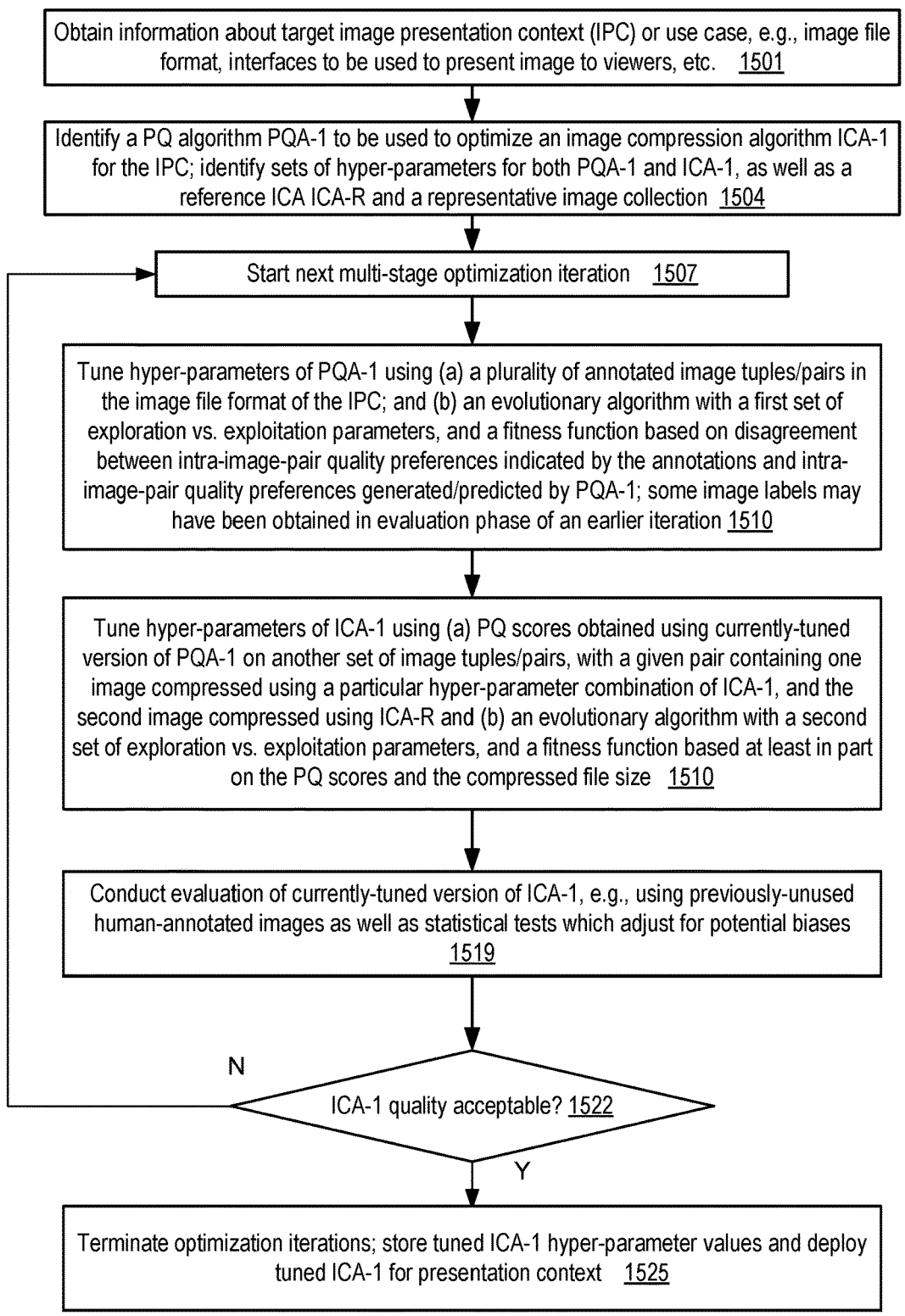
FIG. 15 is a flow diagram illustrating aspects of an iterative compression algorithm optimization technique in which evolutionary techniques are employed, according to at least some embodiments.

FIG. 15 is a flow diagram illustrating aspects of an iterative compression algorithm optimization technique in which evolutionary techniques are employed, according to at least some embodiments. As shown in element 1501, information about a target image presentation context (IPC) or use case may be obtained, for example at a media optimization service (MOS) similar in functionality to MOS 110 of FIG. 1. IPCs may differ from one another in various properties, such as the image file format being used (which in turn may limit the kinds of compression algorithms which can be used), the kinds of interface devices (where the devices are characterized by both their hardware and software components, including browsers and the like) expected to be used by viewers to view the images, the latency constraints with respect to compression (e.g., how quickly a compressed version of an image has to be presented after the original image is received or selected for presentation), and so on. IPC characteristics (including interface devices used by viewers, latency constraints, etc.) may be used to select at least some hyper-parameter values to be explored for the compression algorithms being optimized in different embodiments.

A particular PQ algorithm PQA-1 may be selected for optimizing a particular image compression algorithm ICA-1 for the IPC in the depicted embodiment (element 1504), along with a representative image collection or RIC. In some embodiments, one or both of the algorithms and/or an RIC may be indicated by a client of an MOS via programmatic interfaces. In other embodiments, the MOS may select one or both algorithms and/or the RIC based on the IPC information provided by the client (or based on analysis of webserver logs provided by the client). The sets of hyper-parameters to be tuned for PQA-1 and ICA-1 may be identified, and a reference image compression algorithm ICA-R (with which the compression applied using various hyper-parameter combinations of ICA-1 are to be compared for optimization purposes) may be selected.

Having identified the algorithms and hyper-parameters, one or more multi-stage optimization iterations may be initiated in various embodiments (as indicated in element 1507). In the first stage, hyper-parameters of PQA-1 may be tuned (element 1510). A plurality of image tuples or image pairs in the image file format of the IPC may be chosen, and an evolutionary algorithm with a first set of exploration versus exploitation parameters (e.g., children-per-parent, cross-over rates, mutation rates, etc., as discussed above in the context of FIG. 14) may be used to tune the PQA-1 hyper-parameters in the depicted embodiment. In at least some embodiments, the fitness function used for optimizing PQA-1 may be based on measures of disagreement between intra-image-pair quality preferences indicated by human annotators and intra-image-pair quality preference predicted/generated by PQA-1. In at least some embodiments, one or more image labels that were generated in the evaluation stage (comprising operations corresponding to element 1519 of FIG. 15) of the previous optimization iteration may be used in the tuning of PQA-1.

In one implementation, for example, the following formulae describe a zero-one loss optimization PQA-1 hyper-parameters θ. Consider a dataset D, comprised of some number n of i tuples (x, y). x is itself an image triple x={$x_1$, $x_2$, $x_3$} in which $x_1$ and $x_2$ are images produced using respective ICA hyper-parameter combinations being compared and $x_3$ is a reference image (e.g., the uncompressed version, or a version compressed using a reference ICA such as ICA-R). y∈{0,1} is the human-generated annotation of whether x1 or x2 is preferred (e.g., with 0 indicating that x1 is preferred over x2 when comparing both x1 and x2 to x3, and 1 indicating that x2 is preferred over x1). The evolutionary algorithm then seeks the PQA-1 parameters that minimize a zero-one loss function $$\hat{\theta} = \operatorname*{argmin}_{\theta} \sum_{i=1}^{n} L(y_i, f(x_i; \theta)),$$

where L is the 0-1 loss, i.e.

$$L(i, j) = \begin{cases} 0, & \text{if } i = j, \\ 1, & \text{else.} \end{cases}$$

and $f(x_i; \theta)$ is a function of PQA-1, which calculates or predicts which image among x1 and x2 is preferred under hyper-parameters $\theta$.

In one embodiment in which the MS-SIM algorithm introduced earlier is used as PQA-1, the hyper-parameters optimized using the above formulae may include, for example, the luminance, contrast and similarity exponents $\alpha_M$, $\beta_M$ and $\gamma_M$. In an embodiment in which the fusion model-based algorithm is chosen as PQA-1, the hyper-parameters optimized using the above formulae may include, for example, the number of PQ algorithms whose scores are used in the training records, the types of PQ algorithms whose scores are used in the training records, whether final scores of the PQ algorithms are used or internal intermediary scores of the PQ algorithms are used, the number of fully-connected layers in the neural network of the fusion model, the number of "fake" compressed images (which are actually the reference images) to be used for the training records, and so on.

In the embodiment depicted in FIG. 15, the second stage of the optimization iteration may comprise using the tuned version of PQA-1 identified in the same iteration to tune ICA-1 (element 1510). Using this version of PQA-1, PQ scores may be generated for another set of image pair or tuples (different from those used for optimizing PQA-1) of the MC. A given image pair may contain one image compressed using a particular combination of hyper-parameter values of ICA-1, and one image compressed using the reference ICA, ICA-R. An evolutionary algorithm with a different fitness function and a different exploitation-exploration parameters may be used to identify the best-performing hyper-parameter combinations of ICA-1 in the depicted embodiment. The fitness function may be based on the size of the ICA-1-compressed file size (with smaller file sizes indicating superior fitness), as well as on the PQ scores generated using PQA-1 (with smaller differences with respect to the reference image indicating superior fitness).

In one implementation, logic similar to the following may be used to compute penalties associated with compressed file sizes, and the penalties thus computed may be used in the fitness function.

. . .

if PQ_degradation[compressed_image relative to reference image]>1.02 then penalty[compressed image]+=(50*file size[compressed image]);

if PQ_degradation[compressed_image relative to reference image]>1.05 then penalty[compressed image]+=(100*file size[compressed image]);

. . .

In the above if statements, higher PQ_degredation values (1.05 relative to 1.02) correspond to predictions of worse perceived quality—that is, the PQ algorithm predicts that a compressed image with the 1.05 degradation score would be considered worse, relative to the reference image, than a compressed image with a degradation score of 1.02. The penalty for the compressed image increases with the file size, and also increases with increases in predicted perceived quality degradation. The approach represented by the logic shown above has the advantage that if a given combination HPC1 of hyper-parameters results in a worse degradation score than a different combination HPC2, HPC1 could still be considered a "fitter" combination (or an equally fit combination) relative to HPC2 if HPC1 results in a smaller compressed file size than HPC2. As such, this approach attempts to strike a balance between the goals of obtaining high-perceived-quality compressed images and reducing compressed image file size (and does not reject compression hyper-parameters based purely on file size alone or perceived quality alone).

After the fittest hyper-parameter combination for ICA-1 is identified, a third stage of the optimization iteration may be conducted, comprising evaluation of the tuned version of ICA-1 in the depicted embodiment (element 1519). In this stage, previously-unused human-annotated images as well as statistical tests which adjust for potential biases (e.g., annotator-specific biases which may tend to make some annotators prefer a particular image of a pair based on the relative locations of the images of the pair on a display screen, or biases which are image-specific) may be used to ensure that the tuned version of ICA-1 is evaluated fairly. The biases may be modeled as random effects, e.g., using a logistic mixed-effects statistical model in some embodiments, which has the effect of increasing the variance associated with the evaluation results. In the operations corresponding to element 1519, a determination may be made as to how similar in quality the compressed images generated by the tuned version of ICA-1 are to the compressed images generated by ICA-R (at least some of which may be larger in file size), in the opinion of the human annotators.

If the results of the evaluation indicate that images generated by the tuned version of ICA-1 is deemed sufficiently similar to the reference compressed images, as detected in operations corresponding to element 1522, the optimization iterations may be terminated (element 1525). The tuned hyper-parameter values of ICA-1 may be stored in various embodiments, e.g., in a results repository of the media optimization service. A tuned version of ICA-1, obtained for example from the final optimization iteration, may be utilized for generating images presented in the IPC. If further iterations are needed, operations corresponding to elements 1507 onwards may be conducted for the next iteration. Some of the human-annotated images generated in the evaluation stage of the current iteration may be re-used for further tuning of PQA-1 in the next iteration in at least some embodiments, as mentioned above.

Example Programmatic Interactions Pertaining to Compression Optimization

Figure 16:
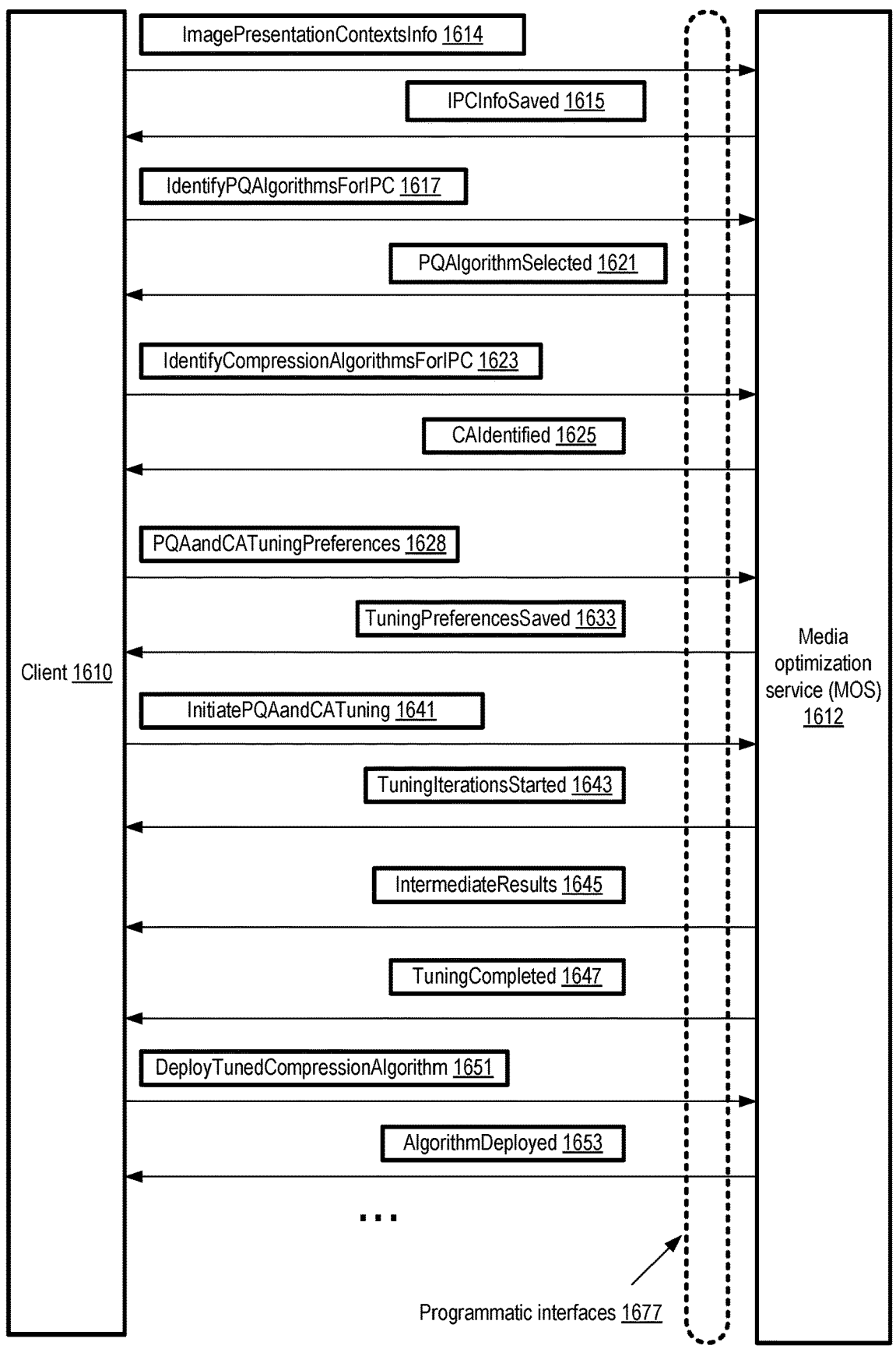
FIG. 16 illustrates example programmatic interactions between a client and a media optimization service, pertaining to iterative compression algorithm optimization, according to at least some embodiments.

FIG. 16 illustrates example programmatic interactions between a client and a media optimization service, pertaining to iterative compression algorithm optimization, according to at least some embodiments. Programmatic interfaces 1677, which may include APIs, web-based consoles, command-line tools, and/or graphical user interfaces may be implemented by an MOS 1612 which supports iterative compression algorithm optimization techniques similar to those discussed in the context of FIG. 13-FIG. 15. Using such interfaces, a client 1610 may send an ImagePresentationContextsInfo message 1614, indicating various properties of one or more target image presentation contexts (IPCs) for which compression algorithms are to be optimized. The information may indicate the kinds of file formats to be used for compressed images, the types of interfaces/devices to be used by image viewers, resource and timing constraints of the image presentation pipeline (e.g., time limits between the decision to present a given image and the time that a compressed version of the image is to be shown), resource constraints of the end-user devices (such as computing capacity limits, memory constraints, etc.) and so on. Resource constraints of the image presentation context and/or he interfaces/devices of the viewers may be used, for example, to select initial hyper-parameter values of compression algorithms during the optimization iterations. The MOS 1612 may store the provided information, and send an IPCInfoSaved response message 1615 back to the client in some embodiments.

In some embodiments, a client 1610 may submit an IdentifyPQAlgorithmsForIPC request, indicating that one or more PQ algorithms suitable for a specified IPC be selected to tune one or more compression algorithms. In response, a knowledge base or a set of compression experts may be consulted, and an indication of a recommended PQ algorithm (such as the MS-SIM, HDR-VDP2, HaarPSI, or fusion algorithms discussed earlier) may be provided to the client via a PQAlgorithmSelected message 1621.

A client may submit an IdentifyCompressionAlgorithmsForIPC request 1623 in various embodiments to the MOS 1612, requesting that candidate compression algorithms (CAs) appropriate for a specified IPC be identified. In response, as in the case of the PQ algorithms, a knowledge base and/or a set of compression experts may be consulted by the MOS, and an indication of a recommended compression algorithm (e.g., some variant of a JPEG compression algorithm) may be provided to the client in a CAIdentified message 1625. Note that in some embodiments, clients may choose PQ algorithms and/or candidate compression algorithms on their own, and may simply notify the MOS 1612 programmatically about the algorithms to be used instead of sending requests similar to 1617 or 1623.

In at least one embodiment, a client 1610 may submit an indication of preferences for iterative compression algorithm tuning, e.g., via one or more PQAandCATuningPreferences messages 1628. These messages may indicate, for example, recommendations for identifying image tuples to be used, initial combinations of hyper-parameters to be used for starting the tuning of a PQ algorithms and/or a compression algorithms (which may be used for the initial populations of the evolutionary algorithms), suggested values or ranges for evolutionary algorithm parameters (including parameters representing tradeoffs between exploration and exploitation discussed above), the maximum count of evolutionary algorithm generations for tuning PQ algorithms and compression algorithms, etc. In effect, the tuning preferences indicated by a client via a message 1628 may help the MOS select values for higher level hyper-parameter for the iterative tuning of the PQA/CA hyper-parameters. A message 1633 indicating that the tuning preferences have been saved may be sent to the client from the MOS in some embodiments after the tuning preferences have been stored.

A client 1610 may submit an InitiatePQAandCATuning request 1641 in some embodiments to trigger the execution of optimization iterations similar to those discussed in the contexts of FIG. 15 or FIG. 13. In some embodiments, a client may not necessarily submit requests to identify PQ algorithms (e.g., similar to requests 1617) and/or compression algorithms (e.g., similar to request 1619) prior to submitting such a tuning request. In one such embodiment, the tuning request 1641 may indicate the PQ and compression algorithms to be used. In other embodiments, the MOS 1612 may select appropriate PQ and/or compression algorithms without being separately requested to do so. Multi-stage optimization iterations may be initiated at the MOS in response to a tuning request 1641, and a TuningIterationsStarted message 1643 may be sent to the client in the depicted embodiment. In some embodiments, as individual iterations are completed, results obtained from the iterations (e.g., quality measures or fitness scores) may be provided to the client 1610 in one or more IntermediateResults messages 1645. After the optimization procedure is terminated, a TuningCompleted message 1647 may be sent to the client. A client 1610 may request that the tuned compression algorithm be deployed for one or more image presentation contexts, e.g., by a content presentation service, by sending a DeployTunedCompressionAlgorithm message 1651 to the MOS 1612 in some embodiments. After the algorithm has been deployed, an AlgorithmDeployed message acknowledging the deployment may be sent to the client.

Example Class-Specific Tuning of Compression Algorithms

The techniques for enhancing perceived quality predictions and/or iteratively optimizing compression algorithms may be employed in many different ways in different embodiments. FIG. 17 is a flow diagram illustrating aspects of a technique in which image class-specific tuning of compression algorithms may be conducted, according to at least some embodiments. As shown in element 1701, a compression algorithm may be tuned using a representative set of images presented in a given context (such as from an e-retail web site to customers browsing or ordering items from laptops/tablet devices/phones). The iterative evolutionary technique discussed earlier may be used in some embodiments. The hyper-parameter values which lead to the least degradation in quality may be identified as part of the tuning exercise, and stored in a default hyper-parameter set HS-default.

One or more important classes of images being served in the given context may be identified, e.g., using machine learning-based object recognition and/or clustering algorithms in the depicted embodiment (element 1704). The definition of "important" may vary for different clients of a media optimization service: for example, images that lead to more revenue being generated overall for an e-retail enterprise may be considered important, or images that lead to more revenue generated per image view may be considered more important. In one e-retail scenario, for example, important class C1 may comprise images of electronic appliances, important class C2 may comprise watches, important class C3 may comprise shoes, etc. In at least some embodiments, clients may programmatically indicate the factors which contribute to importance for their applications, or provide examples of images which can be used (e.g., using searches for image with similar subjects) to classify some images as more important than others.

For each important class identified, a separate compression hyper-parameter tuning exercise may be conducted in at least some embodiments (element 1707), e.g., again using the evolutionary approach discussed earlier. Class-specific tuned hyper-parameter value combinations HS-C1 for class C1, HS-C2 for class C2, etc., may be identified using this approach. The HA-default and class-specific tuned hyper-parameter values may be provided to content presentation services being used for presenting the images to viewers in the depicted embodiment.

When a given image is to be presented to a viewer, a determination may be made at the content presentation service whether the image belongs to one of the important classes identified earlier (element 1710). If so, the appropriate class-specific hyper-parameter combination may be employed to compress the image prior to transmission of the image to the media consumption interface device of the viewer in the depicted embodiment. If the image does not belong to one of the important classes, the HS-default values may be used. In at least some implementations, the process of presenting the images may include the transmission of class-specific data (e.g., tuned class-specific quantization tables) to be used in the de-compression at the media consumption interface devices.

Example Use of Sub-Image-Specific Compression Algorithms

Figure 18:
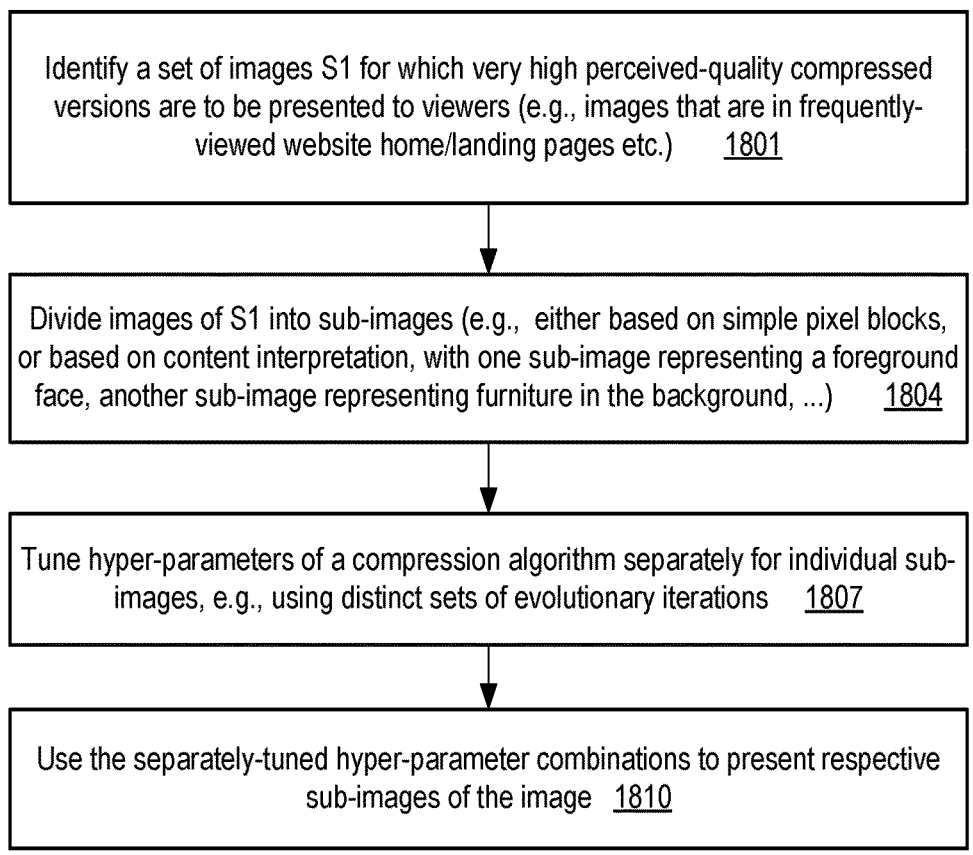
FIG. 18 is a flow diagram illustrating aspects of a technique in which custom tuning of compression algorithms may be conducted for sub-images of a given image, according to at least some embodiments.

FIG. 18 is a flow diagram illustrating aspects of a technique in which custom tuning of compression algorithms may be conducted for sub-images of a given image, according to at least some embodiments. As shown in element 1801, a set of images S1 may be identified for which very high perceived-quality compressed versions are to be presented to viewers. For some websites, visitors to the website may typically access the website through a home page or a small number of landing pages; as a result, the images shown on such pages may be viewed by all the visitors to the web site and may be designated as requiring very high quality compressed versions.

The images of set S1 may be divided into respective groups of sub-images in the depicted embodiment (element 1804). This subdivision may be performed using a variety of techniques in different embodiments. In some embodiments, the image may simply be divided into blocks of pixels (e.g., 32×32 pixel blocks, 128×128 pixel blocks, etc.). In other embodiments, the images may be subdivided based on image content interpretation or semantics, with one sub-image being identified for a foreground face, another for furniture in the background, and so on.

Hyper-parameters for a compression algorithm may then be tuned separately for individual sub-images in the depicted embodiment (element 1807), e.g., using distinct sets of evolutionary iterations of the kind discussed earlier. The separately-tuned hyper-parameter combinations may be used to present the image as a whole, applying different combinations of hyper-parameters to each sub-image (element 1810).

It is noted that in various embodiments, some of the operations shown in the flow diagrams of FIG. 8, FIG. 9, FIG. 13, FIG. 14, FIG. 15, FIG. 17, and/or FIG. 18 may be implemented in a different order than that shown in the figure, or may be performed in parallel rather than sequentially. Additionally, some of the operations shown in FIG. 8, FIG. 9, FIG. 13, FIG. 14, FIG. 15, FIG. 17, and/or FIG. 18 may not be required in one or more implementations.

Use Cases

The techniques described above, of training a machine learning model for perceptual quality prediction using scores obtained from multiple PQ algorithms for adversarial image tuples, and the iterative multi-stage optimization of compression algorithms, may be extremely beneficial in a number of environments. E-retail organizations may have to serve millions of images and/or other content items every day, and even a small reduction in the sizes of the media objects may result in substantial reductions in network bandwidth used, as well as quicker responses to requests from clients. Services or organizations providing access to e-books, e-magazines, e-comics and the like may also benefit from the proposed techniques.

Illustrative Computer System

Figure 19:
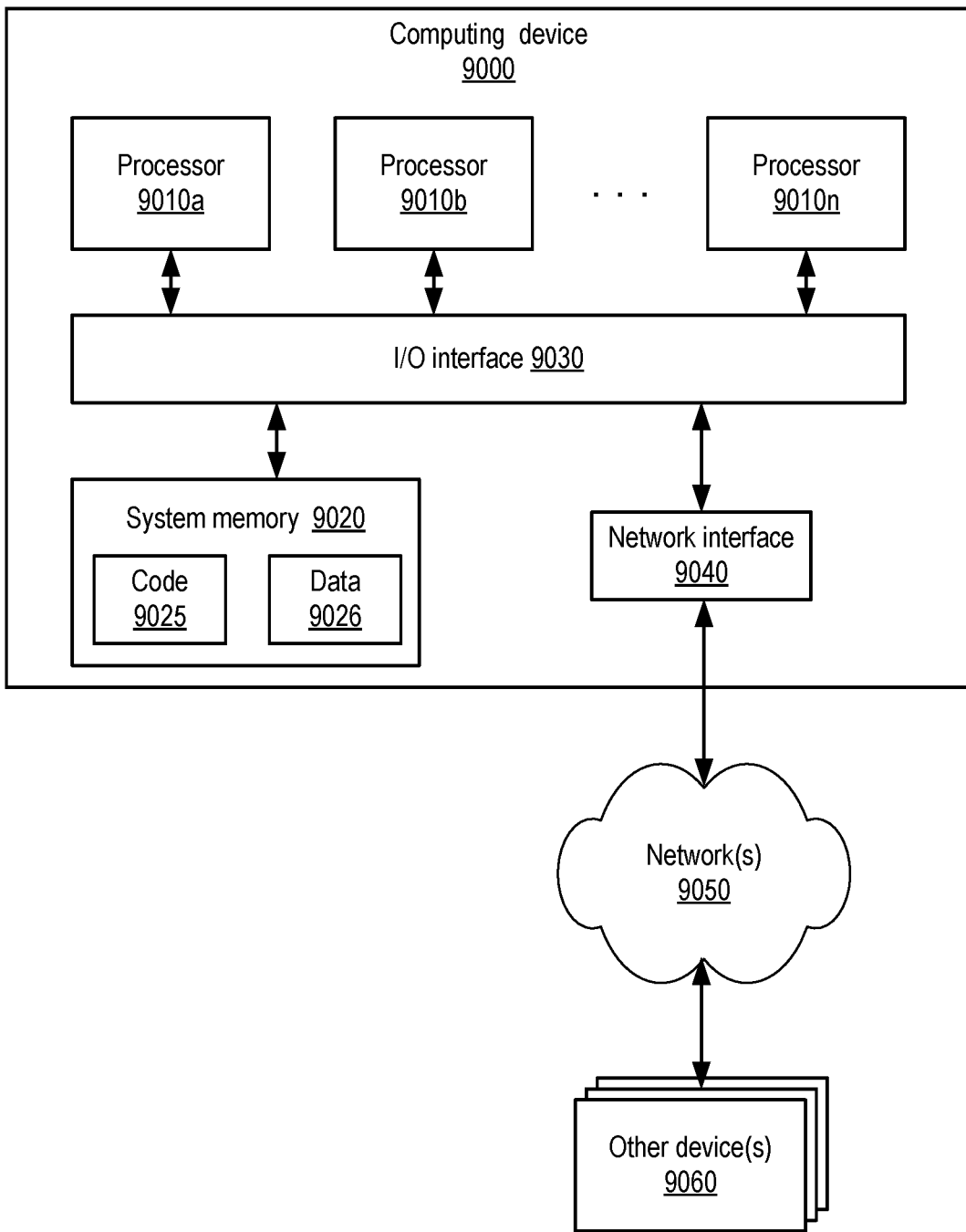
FIG. 19 is a block diagram illustrating an example computing device that may be used in at least some embodiments.

In at least some embodiments, a server that implements one or more of the techniques described herein (e.g., training and executing enhanced models for perceptual quality predictions, optimizing compression algorithms, and/or other functions of a media optimization service and/or a content presentation service), may include a general-purpose computer system that includes or is configured to access one or more computer-accessible media. FIG. 19 illustrates such a general-purpose computing device 9000. In the illustrated embodiment, computing device 9000 includes one or more processors 9010 coupled to a system memory 9020 (which may comprise both non-volatile and volatile memory modules) via an input/output (I/O) interface 9030. Computing device 9000 further includes a network interface 9040 coupled to I/O interface 9030.

In various embodiments, computing device 9000 may be a uniprocessor system including one processor 9010, or a multiprocessor system including several processors 9010 (e.g., two, four, eight, or another suitable number). Processors 9010 may be any suitable processors capable of executing instructions. For example, in various embodiments, processors 9010 may be general-purpose or embedded processors implementing any of a variety of instruction set architectures (ISAs), such as the x86, PowerPC, SPARC, or MIPS ISAs, or any other suitable ISA. In multiprocessor systems, each of processors 9010 may commonly, but not necessarily, implement the same ISA. In some implementations, graphics processing units (GPUs) may be used instead of, or in addition to, conventional processors.

System memory 9020 may be configured to store instructions and data accessible by processor(s) 9010. In at least some embodiments, the system memory 9020 may comprise both volatile and non-volatile portions; in other embodiments, only volatile memory may be used. In various embodiments, the volatile portion of system memory 9020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 9020 as code 9025 and data 9026.

In one embodiment, I/O interface 9030 may be configured to coordinate I/O traffic between processor 9010, system memory 9020, and any peripheral devices in the device, including network interface 9040 or other peripheral interfaces such as various types of persistent and/or volatile storage devices. In some embodiments, I/O interface 9030 may perform any necessary protocol, timing or other data transformations to convert data signals from one component (e.g., system memory 9020) into a format suitable for use by another component (e.g., processor 9010). In some embodiments, I/O interface 9030 may include support for devices attached through various types of peripheral buses, such as a variant of the Peripheral Component Interconnect (PCI) bus standard or the Universal Serial Bus (USB) standard, for example. In some embodiments, the function of I/O interface 9030 may be split into two or more separate components, such as a north bridge and a south bridge, for example. Also, in some embodiments some or all of the functionality of I/O interface 9030, such as an interface to system memory 9020, may be incorporated directly into processor 9010.

Network interface 9040 may be configured to allow data to be exchanged between computing device 9000 and other devices 9060 attached to a network or networks 9050, such as other computer systems or devices as illustrated in FIG. 1 through FIG. 18, for example. In various embodiments, network interface 9040 may support communication via any suitable wired or wireless general data networks, such as types of Ethernet network, for example. Additionally, network interface 9040 may support communication via telecommunications/telephony networks such as analog voice networks or digital fiber communications networks, via storage area networks such as Fibre Channel SANs, or via any other suitable type of network and/or protocol.

In some embodiments, system memory 9020 may represent one embodiment of a computer-accessible medium configured to store at least a subset of program instructions and data used for implementing the methods and apparatus discussed in the context of FIG. 1 through FIG. 18. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 9000 via I/O interface 9030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 9000 as system memory 9020 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 9040. Portions or all of multiple computing devices such as that illustrated in FIG. 19 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

Embodiments of the disclosure can be described in view of the following clauses:

Clause 1. A system, comprising:
one or more computing devices;
wherein the one or more computing devices include instructions that upon execution on or across the one or more computing devices cause the one or more computing devices to:
identify a first plurality of image tuples which satisfy an algorithm-to-algorithm divergence threshold, wherein individual ones of the image tuples comprise a reference image, a first compressed version of the reference image, and a second compressed version of the reference image, and wherein, with respect to a given image tuple, a difference between (a) a first quality degradation score produced by a first perceptual quality algorithm of a first set of perceptual quality algorithms for one or more of the compressed versions relative to the reference image, and (b) a second quality degradation score produced by a second perceptual quality algorithm of the first set for the one or more of the compressed versions relative to the reference image exceeds the divergence threshold;
obtain respective labels from a group of one or more annotators for individual ones of the first plurality of image tuples, wherein a label for a given image tuple indicates which compressed version of the given image tuple is perceived to be more similar to the reference image of the given image tuple;
without utilizing an annotator, automatically generate labels for individual ones of a second plurality of image tuples using quality degradation scores produced by a second set of perceptual quality algorithms;
store a labeled image data set comprising at least some image tuples of the first and second pluralities of image tuples and their respective labels;
generate, using a third set of perceptual quality algorithms, a plurality of pairs of training records for at least a first machine learning model, wherein an individual pair of training records comprises:
a first record which includes (a) a plurality of quality degradation scores for a first compressed image of the labeled image data set, wherein individual ones of the quality degradation scores are obtained using respective perceptual quality algorithms of the third set, and (b) the particular label which was stored in the labeled image data set for the image tuple of which the first compressed version is a member; and
a second record which includes (a) a plurality of quality degradation scores for a second compressed image of the labeled image data set, wherein individual ones of the quality degradation scores are obtained using the respective perceptual quality algorithms of the third set, and (b) the particular label;
train the first machine learning model using the plurality of pairs of training records to predict, for a post-training input record comprising a plurality of quality degradation scores for a particular compressed version of an image, an output quality degradation score for the particular compressed version; and
utilize the output quality degradation score to identify an image for presentation to a viewer.

Clause 2. The system as recited in clause 1, wherein the first machine learning model comprises a symmetric neural network with at least one fully-connected layer and at least one softmax layer.

Clause 3. The system as recited in any one of clauses 1 to 2, wherein the one or more annotators comprise a plurality of annotators, and wherein the one or more computing devices include further instructions that upon execution on or across the one or more computing devices further cause the one or more computing devices to:
analyze the inter-annotator consistency of labels produced by the plurality of annotators; and exclude, from the labeled image data set, at least one image tuple based at least on part on results of the inter-annotator consistency analysis.

Clause 4. The system as recited in any one of clauses 1 to 3, wherein the one or more computing devices include further instructions that upon execution on or across the one or more computing devices further cause the one or more computing devices to:

initiate the identification of the first plurality of image tuples in response to one or more requests obtained via a programmatic interface of a network-accessible service of a provider network.

Clause 5. The system as recited in any one of clauses 1 to 4, wherein a first the third set of perceptual quality algorithms comprises a particular algorithm in which a final quality degradation score is obtained from a plurality of intermediate scores, wherein the plurality of quality degradation scores included for the first compressed image in the first training record comprises an intermediate score of the plurality of intermediate scores.

Clause 6. A method, comprising:

performing, at one or more computing devices:

obtaining respective labels from a group of one or more annotators for individual ones of the first plurality of image tuples which satisfy a first divergence criterion, wherein individual ones of the image tuples comprise a reference image, a first compressed version of the reference image, and a second compressed version of the reference image, and wherein a label for a given image tuple indicates which compressed version of the given image tuple is perceived to be more similar to the reference image of the given image tuple;

storing an labeled image data set comprising at least some image tuples of the first plurality of image tuples and their respective labels;

generating, using a first set of perceptual quality algorithms, a plurality of pairs of training records for at least a first machine learning model, wherein an individual pair of training records comprises:

a first record which includes a plurality of quality degradation scores for a first compressed version of a particular reference image of the labeled image data set, wherein individual ones of the quality degradation scores are obtained using respective perceptual quality algorithms of the first set; and a second record which includes a plurality of quality degradation scores for a second compressed version of the particular reference image, wherein individual ones of the quality degradation scores are obtained using the respective perceptual quality algorithms of the first set; and training the first machine learning model using the plurality of pairs of training records to predict, for a post-training input record comprising a plurality of quality degradation scores for a particular compressed version of an image, a quality degradation score for the particular compressed version.

Clause 7. The method as recited in clause 6, further comprising performing, at one or more computing devices:

without utilizing an annotator, automatically generating labels for individual ones of a second plurality of image tuples using quality degradation scores generated by a second set of perceptual quality algorithms; and storing the second plurality of image tuples and their respective labels as part of the labeled image data set.

Clause 8. The method as recited in any one of clauses 6 to 7, further comprising performing, at one or more computing devices:

determining a difference, with respect to a particular image tuple of a collection of image tuples, between (a) a first quality degradation score generated by a first perceptual quality algorithm for a compressed image of the image tuple and (b) a second quality degradation score generated by a second perceptual quality algorithm for the compressed image; and evaluating the first divergence criterion with respect to the particular image tuple, wherein said evaluating comprises comparing the difference to a threshold.

Clause 9. The method as recited in any one of clauses 6 to 8, wherein the group of one or more annotators comprises a plurality of annotators, the method further comprising performing, at one or more computing devices:

computing, for individual image tuples of the first plurality of image tuples, a measure of inter-annotator consistency; and excluding, from the labeled image data set, at least one image tuple whose inter-annotator consistency measure is below a threshold.

Clause 10. The method as recited in any one of clauses 6 to 9, wherein the group of one or more annotators comprises a plurality of annotators, the method further comprising performing, at one or more computing devices:

excluding, from the labeled image data set, at least one image tuple for which a label was generated by a particular annotator selected based on an analysis of inter-annotator consistency.

Clause 11. The method as recited in any one of clauses 6 to 10, further comprising performing, at one or more computing devices:

training, using additional training records for which labels were generated automatically without using annotators, a second machine learning model to predict quality degradation scores, wherein training the first machine learning model using the plurality of pairs of training records comprises modifying the second machine learning model using the plurality of pairs of training records.

Clause 12. The method as recited in any one of clauses 6 to 11, wherein the first machine learning model comprises a neural network-based model.

Clause 13. The method as recited in any one of clauses 6 to 12, further comprising:

obtaining, at a network-accessible service of a provider network, one or more programmatic requests to train a machine learning model to predict perceived image quality degradation scores, wherein the first machine learning model is trained in response to the one or more programmatic requests.

Clause 14. The method as recited in any one of clauses 6 to 13, further comprising:

obtaining, from a trained version of the first machine learning model, a first set of quality degradation scores for compressed images produced using a first set of hyper-parameters of a compression algorithm, and a second set of quality degradation scores for compressed images produced using a second set of hyper-parameters of the compression algorithm; and causing, based at least in part on a comparison of the first and second sets of quality degradation scores, the first set of hyper-parameters to be employed for presenting a set of images.

Clause 15. The method as recited in any one of clauses 6 to 14, further comprising:
obtaining respective resource consumption metrics of a plurality of perceptual quality algorithms; and
including, in the first set of perceptual quality algorithms, a first perceptual quality algorithm of the plurality of perceptual quality algorithms based at least in part on a comparison of a resource consumption metric of the first perceptual quality algorithm with a corresponding resource consumption metric of a second perceptual quality algorithm of the plurality of perceptual quality algorithms; and
excluding, from the first set of perceptual quality algorithms, the second perceptual quality algorithm based at least in part on the comparison.

Clause 16. One or more non-transitory computer-accessible storage media storing program instructions that when executed on or across one or more processors cause the one or more processors to:
obtain respective labels from a group of one or more annotators for individual ones of the first plurality of media object tuples which satisfy a first divergence criterion, wherein individual ones of the media object tuples comprise a reference media object, a first compressed version of the media object, and a second compressed version of the reference media object, and wherein a label for a given media object tuple indicates which compressed version of the given media object tuple is perceived to be more similar to the reference media object of the given media object tuple;
generate, using a first set of perceptual quality algorithms, a plurality of pairs of training records for at least a first machine learning model, wherein an individual pair of training records comprises:
a first record which includes a plurality of quality degradation scores for a first compressed version of a particular reference media object of a labeled media object data set, wherein individual ones of the quality degradation scores are obtained using respective perceptual quality algorithms of the first set, and wherein the labeled media object data set comprises at least some media object tuples of the first plurality of media object tuples and their respective labels; and
a second record which includes a plurality of quality degradation scores for a second compressed version of the particular reference media object, wherein individual ones of the quality degradation scores are obtained using the respective perceptual quality algorithms of the first set; and
train the first machine learning model using the plurality of pairs of training records to predict, for a post-training input record comprising a plurality of quality degradation scores for a particular compressed version of a media object, a quality degradation score for the particular compressed version.

Clause 17. The one or more non-transitory computer-accessible storage media as recited in clause 16, storing further program instructions that when executed on or across the one or more processors further cause the one or more processors to:
automatically generate labels for individual ones of a second plurality of media object tuples using quality degradation scores generated by a second set of perceptual quality algorithms; and
include the second plurality of media object tuples and their respective labels as part of the labeled media object data set.

Clause 18. The one or more non-transitory computer-accessible storage media as recited in any one of clauses 16 to 17, wherein the first set of perceptual quality algorithms comprises one or more of: (a) an algorithm which utilizes multi-scale decomposition to generate predicted perceived quality degradation scores, (b) an algorithm in which physical image differences are weighted at least according to assumptions about contrast sensitivity, or (c) an algorithm which measures phase coherence in spatial filters.

Clause 19. The one or more non-transitory computer-accessible storage media as recited in any one of clauses 16 to 18, wherein the first machine learning model comprises a neural network-based model.

Clause 20. The one or more non-transitory computer-accessible storage media as recited in any one of clauses 16 to 19, storing further program instructions that when executed on or across the one or more processors further cause the one or more processors to:
identify, using a second set of perceptual quality algorithms, the media object tuples which satisfy the first divergence criterion, wherein the at least one algorithm of the second set is not in the first set of perceptual quality algorithms.

Clause 21. The one or more non-transitory computer-accessible storage media as recited in any one of clauses 16 to 20, storing further program instructions that when executed on or across the one or more processors further cause the one or more processors to:
perform one or more optimization iterations, wherein a particular optimization iteration of the one or more optimization iterations comprises at least:
tuning one or more hyper-parameters of a particular perceptual quality algorithm which utilizes the first machine learning model;
tuning, using a set of perceptual quality scores, one or more hyper-parameters of a first media object compression algorithm, wherein the set of perceptual quality scores is generated for a first set of media objects using a tuned version of the particular perceptual quality algorithm obtained in the particular optimization iteration, and wherein the set of media objects includes a compressed media object obtained using a particular hyper-parameter combination of the first media object compression algorithm; and
conducting a compression quality evaluation test on a set of media objects generated using a tuned version of the first media object compression algorithm obtained in the particular iteration, wherein a result of the quality evaluation test is used to determine whether additional optimization iterations are to be performed.

Clause 22. A system, comprising:
one or more computing devices;
wherein the one or more computing devices include instructions that upon execution on or across the one or more computing devices cause the one or more computing devices to:
obtain an indication, at a media optimization service, of one or more properties of a first image presentation context, including (a) a first image file format and (b) a first type of interface used to present images to viewers;
identify, at the media optimization service, based at least in part on the one or more properties, at least a first perceptual quality algorithm to be used to optimize a first image compression algorithm for the first image presentation context;

perform, at the media optimization service, a plurality of optimization iterations, wherein a particular optimization iteration comprises at least:

tuning one or more hyper-parameters of the first perceptual quality algorithm using an evolutionary algorithm with a first fitness function and an annotated input data set comprising a first plurality of image pairs in the first image file format, wherein respective annotations for at least some image pairs of the input data set are generated in a compression quality evaluation test of an earlier optimization iteration;

tuning, using a set of perceptual quality scores and an evolutionary algorithm with a second fitness function, one or more hyper-parameters of the first image compression algorithm, wherein the set of perceptual quality scores is generated for a second plurality of image pairs using a tuned version of the first perceptual quality algorithm obtained in the particular optimization iteration, and wherein individual ones of the second plurality of image pairs include (a) an image compressed using a particular hyper-parameter combination of the first image compression algorithm and (b) an image compressed using a reference image compression algorithm; and conducting a compression quality evaluation test on a set of images generated using a tuned version of the first image compression algorithm obtained in the particular iteration, wherein a result of the compression quality evaluation test is used to determine whether additional optimization iterations are to be performed; and cause to be presented, via one or more interfaces of the first type of interface, one or more images encoded using a tuned version of the first image compression algorithm obtained from a final optimization iteration of the plurality of optimization iterations.

Clause 23. The system as recited in clause 22, wherein input of the second fitness function with respect to the particular hyper-parameter combination comprises one or more of: (a) a perceptual quality score obtained for the image compressed using the particular hyper-parameter combination or (b) a size of the image compressed using the particular hyper-parameter combination.

Clause 24. The system as recited in any one of clauses 22 to 23, wherein the one or more computing devices include further instructions that upon execution on or across the one or more computing devices further cause the one or more computing devices to:

obtain a request via a programmatic request of the media optimization service, wherein the plurality of optimization iterations is initiated in response to the request.

Clause 25. The system as recited in any one of clauses 22 to 24, wherein the first image file format comprises one of: (a) a JPEG (Joint Photographic Experts Group) format, (b) a WebP format, (c) an AVIF format, or (d) an MP4 (Motion Pictures Experts Group-4) format.

Clause 26. The system as recited in any one of clauses 22 to 25, wherein the one or more hyper-parameters of the first compression algorithm comprise a parameter associated with one or more of: (a) chroma subsampling, (b) block prediction, (c) frequency domain transformation, (d) quantization or (e) run-length encoding.

Clause 27. A method, comprising:
performing, at one or more computing devices:
one or more optimization iterations, wherein a particular optimization iteration of the one or more optimization iterations comprises at least:

tuning one or more hyper-parameters of a first perceptual quality algorithm;

tuning, using a set of perceptual quality scores, one or more hyper-parameters of a first image compression algorithm, wherein the set of perceptual quality scores is generated for a first plurality of image pairs using a tuned version of the first perceptual quality algorithm obtained in the particular optimization iteration, and wherein individual ones of the plurality of image pairs include (a) an image compressed using a particular hyper-parameter combination of a first image compression algorithm and (b) an image compressed using a reference compression algorithm; and conducting a compression quality evaluation test on a set of images generated using a tuned version of the first image compression algorithm obtained in the particular iteration, wherein a result of the quality evaluation test is used to determine whether additional optimization iterations are to be performed; and storing tuned hyper-parameter values of the first compression algorithm which were determined in the one or more optimization iterations.

Clause 28. The method as recited in clause 27, wherein said tuning the one or more hyper-parameters of the first image compression algorithm comprises utilizing an evolutionary algorithm.

Clause 29. The method as recited in clause 28, wherein a fitness function used in the evolutionary algorithm is based at least in part on a penalty value, wherein the penalty value depends at least in part on a file size of a compressed file generated using the first image compression algorithm.

Clause 30. The method as recited in clause 29, wherein the penalty value depends on a difference in perceptual quality scores between (a) the compressed file generated using the first image compression algorithm and (b) a compressed file generated using the reference compression algorithm.

Clause 31. The method as recited in clause 28, further comprising performing, at the one or more computing devices:

determining an initial combination of hyper-parameters of the first image compression algorithm for a first optimization iteration of the one or more optimization iterations based at least in part on one or more of: (a) input received via a programmatic interface, or (b) a knowledge base.

Clause 32. The method as recited in any one of clauses 27 to 28, wherein said tuning the one or more hyper-parameters of the first perceptual quality algorithm comprises utilizing an evolutionary algorithm.

Clause 33. The method as recited in clause 32, wherein a fitness function used in the evolutionary algorithm used for tuning the one or more hyper-parameters of the first perceptual quality algorithm is based at least in part on a metric of disagreement between (a) intra-image-pair quality preferences indicated by one or more annotators and (b) corresponding intra-image-pair quality preferences generated by the perceptual quality algorithm.

Clause 34. The method as recited in any one of clauses 27, 28 or 32, wherein said conducting the compression quality evaluation test comprises:
- identifying a set of source images which have not been used earlier in the one or more optimization iterations;
- generating (a) a first compressed version a particular source image of the set using the reference compression algorithm and (a) a second compressed version of the particular source image using the tuned version of the first compression algorithm;
- obtaining, from one or more annotators, respective indications of the perceived similarity of the first and second compressed versions to the particular source image; and
- utilizing the respective indications to obtain an aggregate metric of a difference between (a) the perceived similarity, to the source images, of compressed versions of the source images obtained using the tuned version of the first image compression algorithm and (b) the perceived similarity, to the source images, of compressed versions of the source images obtained using the reference image compression algorithm.

Clause 35. The method as recited in clause 34, further comprising:
- utilizing, as part of an input data set for the tuning of the one or more hyper-parameters of the first compression algorithm in a subsequent optimization iteration, the first compressed version, the second compressed version and associated similarity indications obtained from the one or more annotators.

Clause 36. The method as recited in clause 34, wherein said conducting the compression quality evaluation further comprises utilizing a mixed-effects model in which one or more of: (a) potential annotator bias or (b) image-specific offsets are modeled as respective random effects.

Clause 37. One or more non-transitory computer-accessible storage media storing program instructions that when executed on or across one or more processors cause the one or more processors to:
- perform one or more optimization iterations, wherein a particular optimization iteration of the one or more optimization iterations comprises at least:
  - tuning one or more hyper-parameters of a first perceptual quality algorithm;
  - tuning, using a set of perceptual quality scores, one or more hyper-parameters of a first media object compression algorithm, wherein the set of perceptual quality scores is generated for a first set of media objects using a tuned version of the first perceptual quality algorithm obtained in the particular optimization iteration, and wherein the set of media objects includes a compressed media object obtained using a particular hyper-parameter combination of the first media object compression algorithm; and
  - conducting a compression quality evaluation test on a set of media objects generated using a tuned version of the first media object compression algorithm obtained in the particular iteration, wherein a result of the quality evaluation test is used to determine whether additional optimization iterations are to be performed.

Clause 38. The one or more non-transitory computer-accessible storage media as recited in clause 37, wherein said tuning the one or more hyper-parameters of the first media object compression algorithm comprises utilizing an evolutionary algorithm.

Clause 39. The one or more non-transitory computer-accessible storage media as recited in any one of clauses 37 to 38, storing further program instructions that when executed on or across the one or more processors further cause the one or more processors to:
- determine an initial combination of hyper-parameters of the first media object compression algorithm for a first optimization iteration of the one or more optimization iterations based at least in part on one or more of: (a) input received via a programmatic interface of a network-accessible service, or (b) a knowledge base.

Clause 40. The one or more non-transitory computer-accessible storage media as recited in any one of clauses 37 to 39, storing further program instructions that when executed on or across the one or more processors further cause the one or more processors to:
- obtain an indication of one or more resource constraints of a presentation context in which the first compression algorithm is to be deployed; and select at least one hyper-parameter value of the particular hyper-parameter combination for the first compression algorithm based at least in part on the one or more resource constraints.

Clause 41. The one or more non-transitory computer-accessible storage media as recited in any one of clauses 37 to 40, storing further program instructions that when executed on or across the one or more processors further cause the one or more processors to:
- obtain an indication of one or more interfaces used in a presentation context in which the first compression algorithm is to be deployed; and
- select at least one hyper-parameter value of the particular hyper-parameter combination for the first compression algorithm based at least in part on the one or more interfaces.

Clause 42. The one or more non-transitory computer-accessible storage media as recited in any one of clauses 37 to 41, storing further program instructions that when executed on or across the one or more processors further cause the one or more processors to:
- obtain respective labels from a group of one or more annotators for individual ones of the first plurality of media object tuples which satisfy a first divergence criterion, wherein individual ones of the media object tuples comprise a reference media object, a first compressed version of the media object, and a second compressed version of the reference media object, and wherein a label for a given media object tuple indicates which compressed version of the given media object tuple is perceived to be more similar to the reference media object of the given media object tuple;
- generate, using a particular set of perceptual quality algorithms, a plurality of pairs of training records for at least a first machine learning model, wherein an individual pair of training records comprises:
  - a first record which includes a plurality of quality degradation scores for a first compressed version of a particular reference media object of a labeled media object data set, wherein individual ones of the quality degradation scores are obtained using respective perceptual quality algorithms of the particular set, and wherein the labeled media object data set comprises at least some media object tuples of the first plurality of media object tuples and their respective labels; and
  - a second record which includes a plurality of quality degradation scores for a second compressed version of the particular reference media object, wherein individual ones of the quality degradation scores are obtained using the respective perceptual quality algorithms of the particular set; and train the first machine learning model using the plurality of pairs of training records to predict, for a post-training input record comprising a plurality of quality degradation scores for a particular compressed version of a media object, a quality degradation score for the particular compressed version, wherein tuning the one or more hyper-parameters of the first perceptual quality algorithm comprises tuning at least one hyper-parameter of the first machine learning model.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electro-magnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
one or more computing devices;
wherein the one or more computing devices include instructions that upon execution on or across the one or more computing devices cause the one or more computing devices to:
identify a first plurality of image tuples which satisfy an algorithm-to-algorithm divergence threshold, wherein individual ones of the image tuples comprise a reference image, a first compressed version of the reference image, and a second compressed version of the reference image, and wherein, with respect to a given image tuple, a difference between (a) a first quality degradation score produced by a first perceptual quality algorithm of a first set of perceptual quality algorithms for one or more of the compressed versions relative to the reference image, and (b) a second quality degradation score produced by a second perceptual quality algorithm of the first set for the one or more of the compressed versions relative to the reference image exceeds the divergence threshold;
obtain respective labels from a group of one or more annotators for individual ones of the first plurality of image tuples, wherein a label for a given image tuple indicates which compressed version of the given image tuple is perceived to be more similar to the reference image of the given image tuple;
without utilizing an annotator, automatically generate labels for individual ones of a second plurality of image tuples using quality degradation scores produced by a second set of perceptual quality algorithms;
store a labeled image data set comprising at least some image tuples of the first and second pluralities of image tuples and their respective labels;
generate, using a third set of perceptual quality algorithms, a plurality of pairs of training records for at least a first machine learning model, wherein an individual pair of training records comprises:
a first record which includes (a) a plurality of quality degradation scores for a first compressed image of the labeled image data set, wherein individual ones of the quality degradation scores are obtained using respective perceptual quality algorithms of the third set, and (b) the particular label which was stored in the labeled image data set for the image tuple of which the first compressed version is a member; and
a second record which includes (a) a plurality of quality degradation scores for a second compressed image of the labeled image data set, wherein individual ones of the quality degradation scores are obtained using the respective perceptual quality algorithms of the third set, and (b) the particular label;
train the first machine learning model using the plurality of pairs of training records to predict, for a post-training input record comprising a plurality of quality degradation scores for a particular compressed version of an image, an output quality degradation score for the particular compressed version; and
utilize the output quality degradation score to identify an image for presentation to a viewer.

2. The system as recited in claim 1, wherein the first machine learning model comprises a symmetric neural network with at least one fully-connected layer and at least one softmax layer.

3. The system as recited in claim 1, wherein the one or more annotators comprise a plurality of annotators, and wherein the one or more computing devices include further instructions that upon execution on or across the one or more computing devices further cause the one or more computing devices to:
analyze the inter-annotator consistency of labels produced by the plurality of annotators; and
exclude, from the labeled image data set, at least one image tuple based at least on part on results of the inter-annotator consistency analysis.

4. The system as recited in claim 1, wherein the one or more computing devices include further instructions that upon execution on or across the one or more computing devices further cause the one or more computing devices to:
initiate the identification of the first plurality of image tuples in response to one or more requests obtained via a programmatic interface of a network-accessible service of a provider network.

5. The system as recited in claim 1, wherein a first the third set of perceptual quality algorithms comprises a particular algorithm in which a final quality degradation score is obtained from a plurality of intermediate scores, wherein the plurality of quality degradation scores included for the first compressed image in the first training record comprises an intermediate score of the plurality of intermediate scores.

6. A method, comprising:

performing, at one or more computing devices:

obtaining respective labels from a group of one or more annotators for individual ones of the first plurality of image tuples which satisfy a first divergence criterion, wherein individual ones of the image tuples comprise a reference image, a first compressed version of the reference image, and a second compressed version of the reference image, and wherein a label for a given image tuple indicates which compressed version of the given image tuple is perceived to be more similar to the reference image of the given image tuple;

storing an labeled image data set comprising at least some image tuples of the first plurality of image tuples and their respective labels;

generating, using a first set of perceptual quality algorithms, a plurality of pairs of training records for at least a first machine learning model, wherein an individual pair of training records comprises:

a first record which includes a plurality of quality degradation scores for a first compressed version of a particular reference image of the labeled image data set, wherein individual ones of the quality degradation scores are obtained using respective perceptual quality algorithms of the first set; and a second record which includes a plurality of quality degradation scores for a second compressed version of the particular reference image, wherein individual ones of the quality degradation scores are obtained using the respective perceptual quality algorithms of the first set; and training the first machine learning model using the plurality of pairs of training records to predict, for a post-training input record comprising a plurality of quality degradation scores for a particular compressed version of an image, a quality degradation score for the particular compressed version.

7. The method as recited in claim 6, further comprising performing, at one or more computing devices:

without utilizing an annotator, automatically generating labels for individual ones of a second plurality of image tuples using quality degradation scores generated by a second set of perceptual quality algorithms; and storing the second plurality of image tuples and their respective labels as part of the labeled image data set.

8. The method as recited in claim 6, further comprising performing, at one or more computing devices:

determining a difference, with respect to a particular image tuple of a collection of image tuples, between (a) a first quality degradation score generated by a first perceptual quality algorithm for a compressed image of the image tuple and (b) a second quality degradation score generated by a second perceptual quality algorithm for the compressed image; and evaluating the first divergence criterion with respect to the particular image tuple, wherein said evaluating comprises comparing the difference to a threshold.

9. The method as recited in claim 6, wherein the group of one or more annotators comprises a plurality of annotators, the method further comprising performing, at one or more computing devices:

computing, for individual image tuples of the first plurality of image tuples, a measure of inter-annotator consistency; and excluding, from the labeled image data set, at least one image tuple whose inter-annotator consistency measure is below a threshold.

10. The method as recited in claim 6, wherein the group of one or more annotators comprises a plurality of annotators, the method further comprising performing, at one or more computing devices:

excluding, from the labeled image data set, at least one image tuple for which a label was generated by a particular annotator selected based on an analysis of inter-annotator consistency.

11. The method as recited in claim 6, further comprising performing, at one or more computing devices:

training, using additional training records for which labels were generated automatically without using annotators, a second machine learning model to predict quality degradation scores, wherein training the first machine learning model using the plurality of pairs of training records comprises modifying the second machine learning model using the plurality of pairs of training records.

12. The method as recited in claim 6, wherein the first machine learning model comprises a neural network-based model.

13. The method as recited in claim 6, further comprising:

obtaining, at a network-accessible service of a provider network, one or more programmatic requests to train a machine learning model to predict perceived image quality degradation scores, wherein the first machine learning model is trained in response to the one or more programmatic requests.

14. The method as recited in claim 6, further comprising:

obtaining, from a trained version of the first machine learning model, a first set of quality degradation scores for compressed images produced using a first set of hyper-parameters of a compression algorithm, and a second set of quality degradation scores for compressed images produced using a second set of hyper-parameters of the compression algorithm; and causing, based at least in part on a comparison of the first and second sets of quality degradation scores, the first set of hyper-parameters to be employed for presenting a set of images.

15. The method as recited in claim 6, further comprising:

obtaining respective resource consumption metrics of a plurality of perceptual quality algorithms; and including, in the first set of perceptual quality algorithms, a first perceptual quality algorithm of the plurality of perceptual quality algorithms based at least in part on a comparison of a resource consumption metric of the first perceptual quality algorithm with a corresponding resource consumption metric of a second perceptual quality algorithm of the plurality of perceptual quality algorithms; and excluding, from the first set of perceptual quality algorithms, the second perceptual quality algorithm based at least in part on the comparison.

16. One or more non-transitory computer-accessible storage media storing program instructions that when executed on or across one or more processors cause the one or more processors to:

obtain respective labels from a group of one or more annotators for individual ones of the first plurality of media object tuples which satisfy a first divergence criterion, wherein individual ones of the media object tuples comprise a reference media object, a first compressed version of the media object, and a second compressed version of the reference media object, and wherein a label for a given media object tuple indicates which compressed version of the given media object tuple is perceived to be more similar to the reference media object of the given media object tuple;

generate, using a first set of perceptual quality algorithms, a plurality of pairs of training records for at least a first machine learning model, wherein an individual pair of training records comprises:
- a first record which includes a plurality of quality degradation scores for a first compressed version of a particular reference media object of a labeled media object data set, wherein individual ones of the quality degradation scores are obtained using respective perceptual quality algorithms of the first set, and wherein the labeled media object data set comprises at least some media object tuples of the first plurality of media object tuples and their respective labels; and
- a second record which includes a plurality of quality degradation scores for a second compressed version of the particular reference media object, wherein individual ones of the quality degradation scores are obtained using the respective perceptual quality algorithms of the first set; and train the first machine learning model using the plurality of pairs of training records to predict, for a post-training input record comprising a plurality of quality degradation scores for a particular compressed version of a media object, a quality degradation score for the particular compressed version.

17. The one or more non-transitory computer-accessible storage media as recited in claim 16, storing further program instructions that when executed on or across the one or more processors further cause the one or more processors to:
- automatically generate labels for individual ones of a second plurality of media object tuples using quality degradation scores generated by a second set of perceptual quality algorithms; and
- include the second plurality of media object tuples and their respective labels as part of the labeled media object data set.

18. The one or more non-transitory computer-accessible storage media as recited in claim 16, wherein the first set of perceptual quality algorithms comprises one or more of: (a) an algorithm which utilizes multi-scale decomposition to generate predicted perceived quality degradation scores, (b) an algorithm in which physical image differences are weighted at least according to assumptions about contrast sensitivity, or (c) an algorithm which measures phase coherence in spatial filters.

19. The one or more non-transitory computer-accessible storage media as recited in claim 16, wherein the first machine learning model comprises a neural network-based model.

20. The one or more non-transitory computer-accessible storage media as recited in claim 16, storing further program instructions that when executed on or across the one or more processors further cause the one or more processors to:
- identify, using a second set of perceptual quality algorithms, the media object tuples which satisfy the first divergence criterion, wherein the at least one algorithm of the second set is not in the first set of perceptual quality algorithms.

* * * * *